(12) United States Patent
Yamazaki et al.

(10) Patent No.: US 8,748,880 B2
(45) Date of Patent: Jun. 10, 2014

(54) SEMICONDUCTOR DEVICE WITH OXIDE SEMICONDUCTOR

(75) Inventors: Shunpei Yamazaki, Tokyo (JP); Daisuke Kawae, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 365 days.

(21) Appl. No.: 12/949,949

(22) Filed: Nov. 19, 2010

(65) Prior Publication Data

US 2011/0121288 A1 May 26, 2011

(30) Foreign Application Priority Data

Nov. 20, 2009 (JP) ................................. 2009-265028

(51) Int. Cl.
*H01L 29/10* (2006.01)
*H01L 29/786* (2006.01)

(52) U.S. Cl.
CPC ................................. *H01L 29/7869* (2013.01)
USPC .......................................................... 257/43

(58) Field of Classification Search
CPC .................................................. H01L 29/7869
USPC .......................................................... 257/43
See application file for complete search history.

(56) References Cited

U.S. PATENT DOCUMENTS

| | | | |
|---|---|---|---|
| 4,668,969 A * | 5/1987 | Yamazaki | 257/58 |
| 5,233,207 A | 8/1993 | Anzai | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

International Search Report, PCT Application No. PCT/JP2010/069545, dated Dec. 7, 2010, 3 pages.

(Continued)

*Primary Examiner* — Ajay K Arora
(74) *Attorney, Agent, or Firm* — Fish & Richardson P.C.

(57) ABSTRACT

Provided is a semiconductor device for high power application including a novel semiconductor material with high productivity. Alternatively, provided is a semiconductor device having a novel structure in which the novel semiconductor material is used. Provided is a vertical transistor including a channel formation region formed using an oxide semiconductor which has a wider band gap than a silicon semiconductor and is an intrinsic semiconductor or a substantially intrinsic semiconductor with impurities that can serve as electron donors (donors) in the oxide semiconductor removed. The thickness of the oxide semiconductor is greater than or equal to 1 μm, preferably greater than 3 μm, more preferably greater than or equal to 10 μm, and end portions of one of electrodes that are in contact with the oxide semiconductor is placed inside end portions of the oxide semiconductor.

28 Claims, 23 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,851,792 B2 | 12/2010 | Aiba et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0086933 A1 | 4/2006 | Iechi et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214571 A1 | 9/2006 | Yamamoto et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0272970 A1 | 11/2009 | Aiba et al. |
| 2009/0278122 A1 | 11/2009 | Hosono et al. |
| 2009/0280600 A1 | 11/2009 | Hosono et al. |
| 2010/0051938 A1* | 3/2010 | Hayashi et al. ............... 257/43 |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0148168 A1* | 6/2010 | Lai et al. ..................... 257/43 |
| 2010/0276689 A1 | 11/2010 | Iwasaki |
| 2010/0279462 A1 | 11/2010 | Iwasaki |

FOREIGN PATENT DOCUMENTS

| | | |
|---|---|---|
| JP | 60-012769 A | 1/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-283879 A | 11/1989 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-133819 A | 5/2000 |
| JP | 2000-150900 A | 5/2000 |
| JP | 2002050633 A * | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 A | 4/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2006-165529 A | 6/2006 |
| JP | 2009-099847 A | 5/2009 |
| JP | JP2010040815 A | 2/2010 |
| WO | 2004/114391 A1 | 12/2004 |
| WO | 2006/051993 A2 | 5/2006 |
| WO | 2007/029844 A1 | 3/2007 |
| WO | 2007/055256 A1 | 5/2007 |
| WO | 2008/126879 A1 | 10/2008 |

OTHER PUBLICATIONS

Written Opinion, PCT Application No. PCT/JP2010/069545, dated Dec. 7, 2010, 4 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

(56) References Cited

OTHER PUBLICATIONS

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeon, S et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-ga2ZnO4-ZnO system at 1350°C," Journal of Solid State Chemistry, Aug. 1, 1991, vol. 93, No. 2, pp. 298-315.

(56) References Cited

OTHER PUBLICATIONS

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13. 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTs With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In-Ga-Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

* cited by examiner

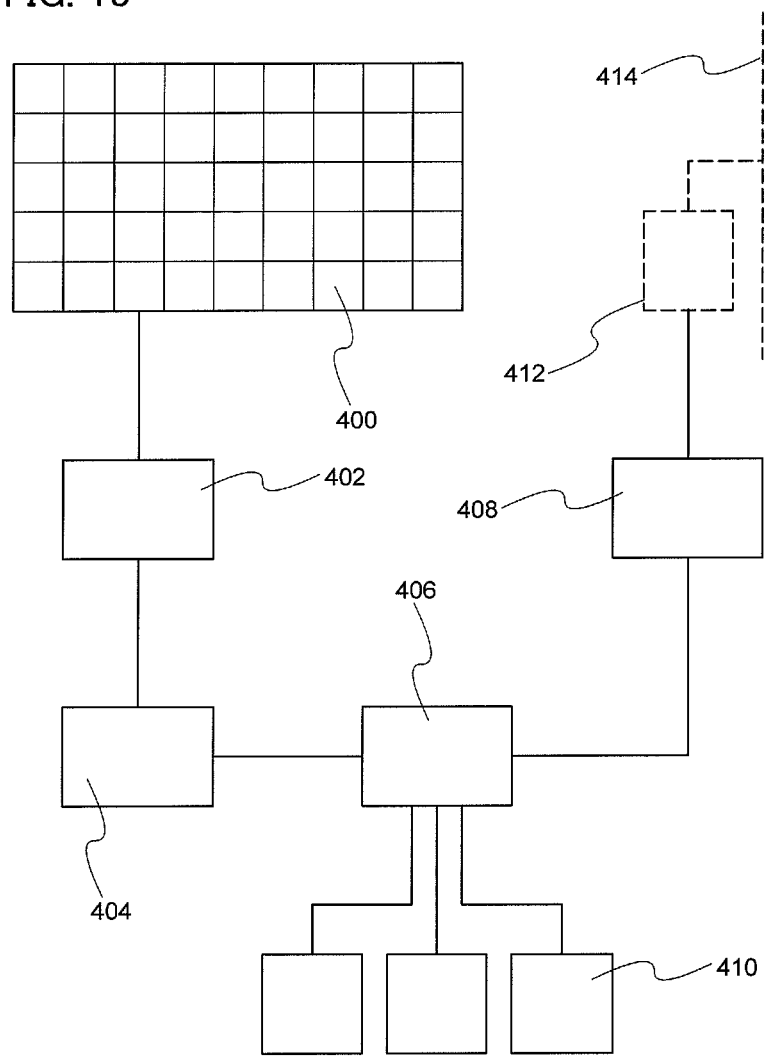

SEMICONDUCTOR DEVICE WITH OXIDE SEMICONDUCTOR

TECHNICAL FIELD

The technical field of the disclosed invention relates to transistors each including an oxide semiconductor and semiconductor devices each including any of the transistors.

BACKGROUND ART

A technique for forming a thin film transistor (TFT) by using a thin semiconductor film formed over a substrate having an insulating surface has attracted attention. A thin film transistor is used for a display device typified by a liquid crystal television. A silicon-based semiconductor material is known as a material for a thin semiconductor film that can be applied to a thin film transistor, and in addition, an oxide semiconductor has attracted attention as another material that can be applied to a thin film transistor.

As a material of the oxide semiconductor, zinc oxide or a material containing zinc oxide as its component is known. Further, a thin film transistor formed using an amorphous oxide (an oxide semiconductor) having an electron carrier density of lower than $10^{18}$ cm$^{-3}$ is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

A transistor used for a semiconductor device for high power application needs to have characteristics of high withstand voltage, high conversion efficiency, and high-speed switching. Nowadays, silicon is used as a semiconductor material for such a semiconductor device; however, from the above-described point of view, a novel semiconductor material which can further improve the characteristics is required.

As an example of a semiconductor material which can improve the above characteristics, silicon carbide can be given. Since silicon carbide has a small interatomic distance of about 0.18 nm in a Si—C bond, a high bond energy, and a large band gap which is about three times as wide as that of silicon, it is known that silicon carbide is advantageous in increasing the withstand voltage of a semiconductor device, reducing a loss of electric power, and the like.

However, it is difficult to melt silicon carbide because of its characteristics; therefore, silicon carbide cannot be manufactured by a method having high productivity such as a Czochralski (CZ) method or the like which is used for manufacturing a silicon wafer. Moreover, there is also a problem in that silicon carbide has defects called micropipes. Owing to these problems, commercialization of a semiconductor device using silicon carbide is delayed.

In view of the foregoing problems, an object of one embodiment of the disclosed invention is to provide a semiconductor device for high power application in which a novel semiconductor material having high productivity is used.

Another object is to provide a semiconductor device having a novel structure in which the novel semiconductor material is used.

One embodiment of the present invention is a vertical transistor including a channel formation region formed using an oxide semiconductor which has a wider band gap than a silicon semiconductor and is an intrinsic semiconductor or a substantially intrinsic semiconductor with impurities that can serve as electron donors (donors) in the oxide semiconductor removed, in which the thickness of the oxide semiconductor is greater than or equal to 1 μm, preferably greater than 3 μm, more preferably greater than or equal to 10 μm, and end portions of one of electrodes that are in contact with the oxide semiconductor are placed on the inner side than end portions of the oxide semiconductor.

One embodiment of the present invention is a vertical transistor including a channel formation region formed using an oxide semiconductor which has a wider band gap than a silicon semiconductor and is an intrinsic semiconductor or a substantially intrinsic semiconductor with impurities that can serve as electron donors (donors) in the oxide semiconductor removed, in which the thickness of the oxide semiconductor is greater than or equal to 1 μm, preferably greater than 3 μm, more preferably greater than or equal to 10 μm, end portions of one of electrodes that are in contact with the oxide semiconductor are placed on the inner side than end portions of the oxide semiconductor, and a crystal region is formed in a region of the oxide semiconductor that is in contact with a gate insulating film.

That is, one embodiment of the present invention is a vertical transistor including a channel formation region formed using an oxide semiconductor film in which hydrogen contained in the oxide semiconductor is reduced preferably to a hydrogen concentration of lower than or equal to $1\times10^{16}$ cm$^{-3}$, and hydrogen or OH group contained in the oxide semiconductor is removed, and carrier density is lower than $1\times10^{14}$ cm$^{-3}$, preferably lower than $1\times10^{12}$ cm$^{-3}$, more preferably lower than $1\times10^{11}$ cm$^{-3}$ which is lower than or equal to a measurement limit.

The band gap of the oxide semiconductor is greater than or equal to 2 eV, preferably greater than or equal to 2.5 eV, more preferably greater than or equal to 3 eV, impurities, e.g., hydrogen that serves as a donor, are reduced as much as possible so that the carrier density is lower than $1\times10^{14}$ cm$^{-3}$, preferably lower than $1\times10^{12}$ cm$^{-3}$, more preferably lower than $1\times10^{11}$ cm$^{-3}$ which is lower than or equal to the measurement limit.

By using such a highly-purified oxide semiconductor in a channel formation region of a transistor, a channel can be formed not only at a surface of the oxide semiconductor that is in contact with the gate insulating film but also inside the oxide semiconductor (in the entire region of the oxide semiconductor film). In an off-state, a depletion layer spreads in a deeper region inside the oxide semiconductor; therefore, the amount of an off-state current which flows in the off-state can be reduced. Further, the withstand voltage is increased and hot-carrier degradation is unlikely to occur; accordingly, a semiconductor device for high power application to which a high voltage is applied can be manufactured.

Note that in one embodiment of the present invention, a gate electrode of the transistor has a ring shape and surrounds a source electrode, an oxide semiconductor film, and a drain electrode with a gate insulating film interposed therebetween. Therefore, the channel width is large.

The transistor which is one embodiment of the present invention may be an insulated-gate field-effect transistor (IGFET) or a power MOSFET.

With one embodiment of the present invention including an oxide semiconductor in which the hydrogen concentration is reduced and the purity is increased, a transistor can be favorably operated. In particular, the withstand voltage can be increased, a short-channel effect can be suppressed, and an on/off ratio can be increased. Thus, with use of the transistor, a semiconductor device for high power application can be manufactured.

BRIEF DESCRIPTION OF DRAWINGS

FIG. 18 illustrates a diagram of an example of a solar power generation system.

BEST MODE FOR CARRYING OUT THE INVENTION

Figure 1A:
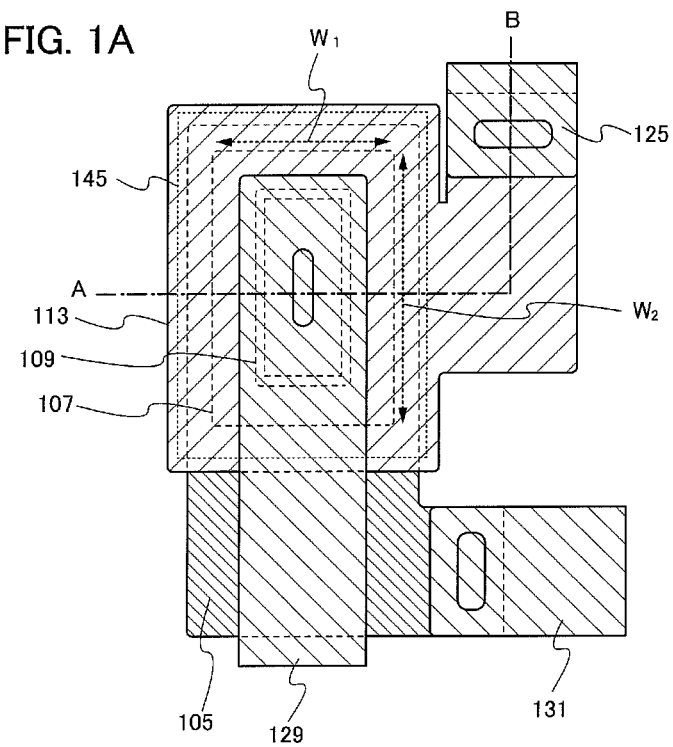
FIGS. 1A and 1B illustrate a top view and a cross-sectional view of a transistor, respectively.

Embodiments of the present invention will be described with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in structures of the present invention described hereinafter, like portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note also that the terms such as "first", "second", and "third" in this specification are used in order to avoid confusion between components and do not set a limitation on number. Therefore, for example, the term "first" can be replaced with the term "second", "third", or the like as appropriate.

Note also that a voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, a structure of a transistor will be described with reference to FIGS. 1A and 1B.

Figure 1B:
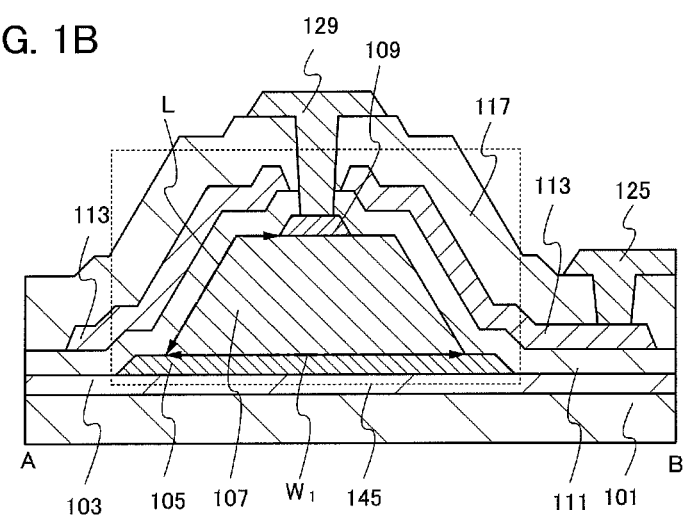

FIG. 1A is a top view of a transistor 145, and FIG. 1B corresponds to a cross-sectional view taken along dashed line A-B in FIG. 1A.

As illustrated in FIG. 1B, a first electrode 105, an oxide semiconductor film 107, and a second electrode 109 are stacked over an insulating film 103 formed over a substrate 101. Note that end portions of the second electrode 109 are positioned inside end portions of the oxide semiconductor film 107. A gate insulating film 111 is provided so as to cover the first electrode 105, the oxide semiconductor film 107, and the second electrode 109. Over the gate insulating film 111, a third electrode 113 is formed so as to face at least side surfaces of the oxide semiconductor film and the second electrode. An insulating film 117 functioning as an interlayer insulating film is provided over the gate insulating film 111 and the third electrode 113. Openings are formed in the insulating film 117, and a wiring 131 (see FIG. 1A) which is connected to the first electrode 105 through the opening, a wiring 129 which is connected to the second electrode 109 through the opening, and a wiring 125 which is connected to the third electrode 113 through the opening are formed. Note that in this specification, a "top surface" of a film indicates a surface that is opposite to the substrate 101 in a pair of surfaces parallel to the substrate 101.

The first electrode 105 functions as one of a source electrode and a drain electrode of the transistor 145. The second electrode 109 functions as the other of the source electrode and the drain electrode of the transistor 145. The third electrode 113 functions as a gate electrode of the transistor 145.

In this embodiment, the third electrode 113 functioning as the gate electrode has a ring shape. When the third electrode 113 functioning as the gate electrode has a ring shape, the channel width of the transistor can be increased. In the transistor of this embodiment, the channel length L is a distance between the first electrode 105 and the second electrode 109 in a region where the oxide semiconductor film and the gate insulating film are in contact with each other in a cross-sectional structure. In addition, the channel width W is a length of an end portion of the oxide semiconductor film that is in contact with the first electrode or the second electrode. Note that in this embodiment, W is the length of an end portion of the oxide semiconductor film that is in contact with one of the first electrode and the second electrode, which has a larger area than the other, and is in contact with the oxide semiconductor film. In this embodiment, since the shape of the top surface of the oxide semiconductor film of the transistor is rectangular with a side $W_1$ and a side $W_2$, the channel width W is the sum of $2W_1$ and $2W_2$. Note that in the case where the shape of the top surface of the oxide semiconductor film of the transistor is circular, the channel width W is $2\pi r$ where r is a radius of the oxide semiconductor film.

In addition, the thickness of the oxide semiconductor film 107 is greater than or equal to 1 μm, preferably greater than 3 μm, more preferably greater than or equal to 10 μm.

An oxide semiconductor film of the transistor of this embodiment is an intrinsic semiconductor in which the intrinsic carrier density is extremely low; therefore, in the transistor, the maximum width of a depletion layer is extremely large, and the depletion layer spreads inside the oxide semiconductor film.

Note that a transistor is an element having at least three terminals: a gate, a drain, and a source. The transistor has a channel formation region between a drain region and a source region, and current can flow through the drain region, the channel formation region, and the source region. Here, since the source and the drain are interchangeable depending on a structure, operating conditions, and the like of the transistor, it is difficult to define which is a source or a drain. Thus, a region which serves as a source and a drain is not referred to as a source or a drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Alternatively, one of the source and the drain may be referred to as a first region and the other of the source and the drain may be referred to as a second region.

It is necessary that the substrate 101 have at least enough heat resistance to withstand heat treatment to be performed later. As the substrate 101, a glass substrate of barium borosilicate glass, aluminoborosilicate glass, or the like can be used.

As the glass substrate, in the case where the temperature of the heat treatment performed later is high, the one whose strain point is 730° C. or higher is preferably used. As the glass substrate, a glass material such as aluminosilicate glass, aluminoborosilicate glass, or barium borosilicate glass is used, for example. In general, a glass substrate is heat-resistant and of more practical use by containing a larger amount of barium oxide (BaO) than boron oxide. Therefore, a glass substrate containing BaO and $B_2O_3$ so that the amount of BaO is larger than that of $B_2O_3$ is preferably used.

Note that, instead of the glass substrate described above, a substrate formed using an insulator, such as a ceramic substrate, a quartz substrate, or a sapphire substrate, may be used. Alternatively, crystallized glass or the like may be used.

The insulating film 103 is formed using an oxide insulating film such as a silicon oxide film or a silicon oxynitride film; or a nitride insulating film such as a silicon nitride film, a silicon nitride oxide film, an aluminum nitride film, or an aluminum nitride oxide film. In addition, the insulating film 103 may have a stacked structure, for example, a stacked structure in which one or more of the nitride insulating films and one or more of the oxide insulating films are stacked in that order over the substrate 101.

The first electrode 105 and the second electrode 109 are formed using a metal element selected from aluminum, chromium, copper, tantalum, titanium, molybdenum, tungsten, and yttrium; an alloy containing any of these metal elements as a component; an alloy containing these metal elements in combination; or the like. Alternatively, one or more metal elements selected from manganese, magnesium, zirconium, and beryllium can be used. In addition, the first electrode 105 can have a single-layer structure or a stacked structure having two or more layers. For example, a single-layer structure of an aluminum film including silicon, a two-layer structure in which a titanium film is stacked over an aluminum film, a two-layer structure in which a titanium film is stacked over a tungsten film, a three-layer structure in which a titanium film, an aluminum film, and a titanium film are stacked in the order, and the like can be given. Alternatively, a film, an alloy film, or a nitride film which contains aluminum and one or more elements selected from titanium, tantalum, tungsten, molybdenum, chromium, neodymium, and scandium may be used.

The first electrode 105 and the second electrode 109 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As the oxide semiconductor film 107, any of the following oxide semiconductor films can be used: an In—Sn—Ga—Zn—O film that is a quaternary metal oxide; an In—Ga—Zn—O film, an In—Sn—Zn—O film, In—Al—Zn—O film, an Sn—Ga—Zn—O film, an Al—Ga—Zn—O film, or an Sn—Al—Zn—O film that is a ternary metal oxide; an In—Zn—O film, an Sn—Zn—O film, an Al—Zn—O film, a Zn—Mg—O film, an Sn—Mg—O film, or an In—Mg—O film that is a binary metal oxide; an In—O film; an Sn—O film; a Zn—O film; and the like. Further, $SiO_2$ may be contained in the above oxide semiconductor film.

As the oxide semiconductor film 107, a thin film expressed by $InMO_3 (ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor film whose composition formula is expressed by $InMO_3 (ZnO)_m$ (m>0) where at least Ga is included as M is referred to as the In—Ga—Zn—O oxide semiconductor described above, and a thin film thereof is also referred to as an In—Ga—Zn—O film.

In the oxide semiconductor film 107 used in this embodiment, hydrogen contained in the oxide semiconductor film is reduced, or preferably removed. That is, the oxide semiconductor film 107 is highly-purified so that impurities that are not main components of the oxide semiconductor film are contained as little as possible. The hydrogen concentration in the oxide semiconductor film 107 in this case is preferably lower than or equal to $1\times10^{16}$ cm$^{-3}$. In addition, the carrier density in the oxide semiconductor film 107 is lower than $1\times10^{14}$ cm$^{-3}$, preferably lower than $1\times10^{12}$ cm$^{-3}$, more preferably lower than $1\times10^{11}$ cm$^{-3}$ which is lower than or equal to the measurement limit. That is, the carrier density in the oxide semiconductor film is as close to zero as possible. Furthermore, the band gap of the oxide semiconductor is greater than or equal to 2 eV, preferably greater than or equal to 2.5 eV, more preferably greater than or equal to 3 eV. The concentration of hydrogen in the oxide semiconductor film can be measured by secondary ion mass spectroscopy (SIMS). The carrier density can be measured by the Hall effect measurement.

The thickness of the oxide semiconductor film 107 is greater than or equal to 1 μm, preferably greater than 3 μm, more preferably greater than or equal to 10 μm. By increasing the thickness of the oxide semiconductor film 107, it is possible to reduce a short channel effect (e.g., variation in a threshold voltage or reduction in on/off ratio), so that a semiconductor device for high power application can be manufactured.

The gate insulating film 111 can be formed with a single layer or a stacked layer of one or more of a silicon oxide film, a silicon nitride film, a silicon oxynitride film, a silicon nitride oxide film, and an aluminum oxide film. A portion of the gate insulating film 111 that is in contact with the oxide semiconductor film 107 preferably contain oxygen, and is more preferably formed using a silicon oxide film. By using the silicon oxide film, it is possible to supply oxygen to the oxide semiconductor film 107, so that characteristics can be improved.

The gate insulating film 111 is formed using a high-k material such as hafnium silicate ($HfSiO_x$), hafnium silicate to which N is added ($HfSiO_xN_y$), hafnium aluminate ($HfAlO_x$), hafnium oxide, or yttrium oxide, so that gate leakage current can be reduced. Further, a stacked structure in which a high-k material and one or more of a silicon oxide film, a silicon nitride film, a silicon oxynitride film, a silicon nitride oxide film, and an aluminum oxide film are stacked can be used. The thickness of the gate insulating film 111 is preferably greater than or equal to 50 nm and less than or equal to 500 nm. The large thickness of the gate insulating film 111 makes it possible to reduce the gate leakage current.

The third electrode 113 functioning as a gate electrode is formed using a metal element selected from aluminum, chromium, copper, tantalum, titanium, molybdenum, and tungsten; an alloy containing any of these metal elements as a component; an alloy film containing these metal elements in combination; or the like. Further, one or more metal elements selected from manganese, magnesium, zirconium, and beryllium may be used. In addition, the third electrode 113 can have a single-layer structure or a stacked-layer structure having two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum and one or a plurality of elements selected from titanium, tantalum, tungsten, molybdenum, chromium, neodymium, and scandium may be used.

The third electrode 113 functioning as the gate electrode can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

Next, operation of the transistor including the oxide semiconductor film 107 will be described with reference to energy band diagrams.

Figure 5:
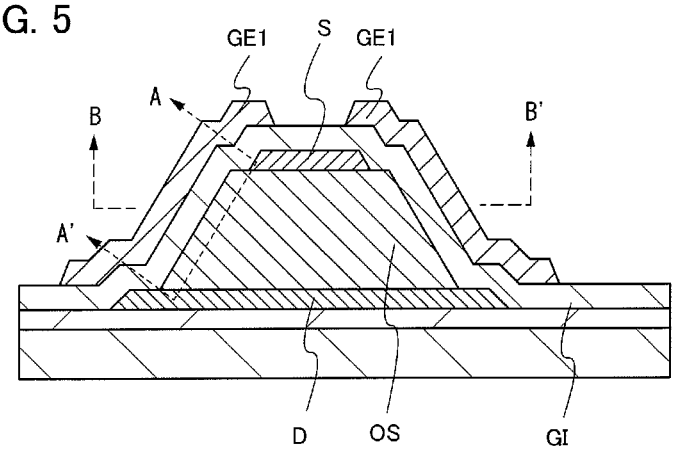
FIG. 5 illustrates a longitudinal sectional view of a vertical transistor in which an oxide semiconductor is used.

FIG. 5 is a longitudinal sectional view of a vertical transistor in which an oxide semiconductor is used. An oxide semiconductor layer (OS) is formed over a drain electrode (D), and a source electrode (S) is formed over the oxide semiconductor layer (OS). A gate insulating film (GI) is provided over the drain electrode, the oxide semiconductor layer, and the source electrode, and a gate electrode (GE1) is provided thereover.

Figure 6A:
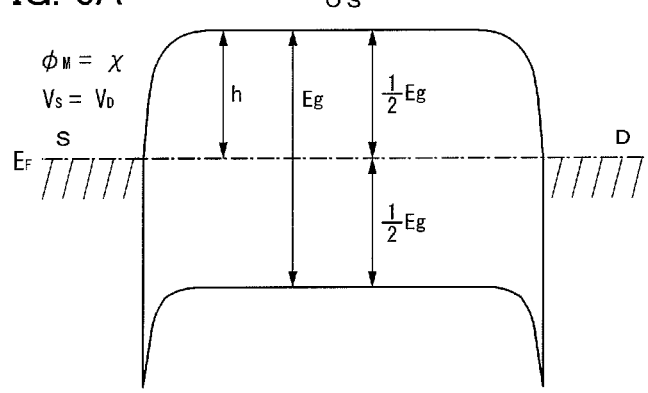
FIGS. 6A and 6B are energy band diagrams (schematic diagrams) in a cross-section taken along line A-A' in FIG. 5.
Figure 6B:
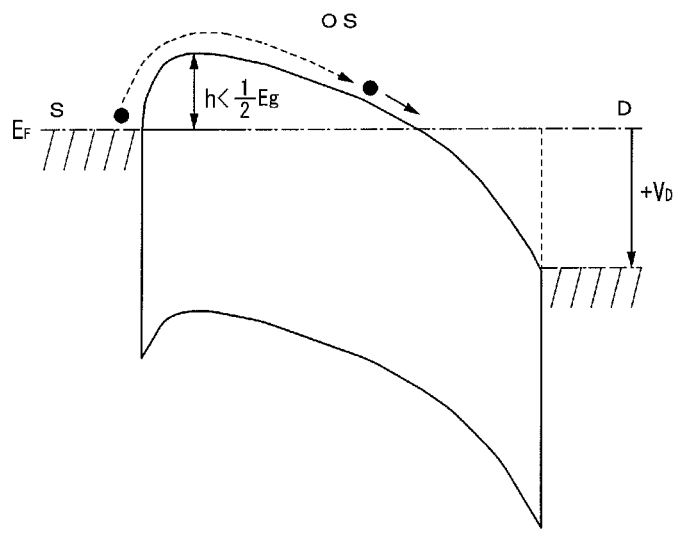

FIGS. 6A and 6B are energy band diagrams (schematic diagrams) in a cross-section taken along line A-A' in FIG. 5. FIG. 6A illustrates the case where the potential of voltage applied to the source is equal to the potential of voltage applied to the drain ($V_D$=0V), and FIG. 6B illustrates the case where a positive voltage is applied to the gate voltage ($V_G$>0) and a positive potential with respect to the source is applied to the drain ($V_D$>0) in FIG. 5.

Figure 8:
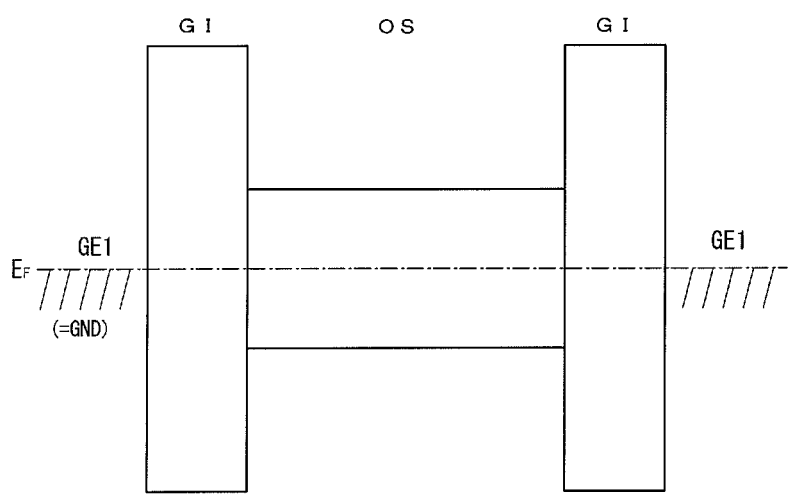
FIG. 8 is an energy band diagram in a cross-section taken along line B-B' in FIG. 5.
Figure 9A:
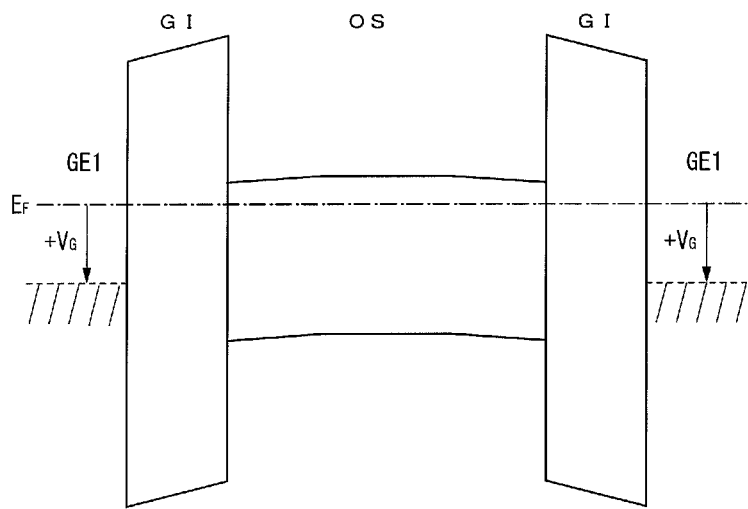
FIGS. 9A and 9B respectively show a state in which a positive potential ($+V_G$) is applied to a gate (G1), and a state in which a negative potential ($-V_G$) is applied to the gate (G1).
Figure 9B:
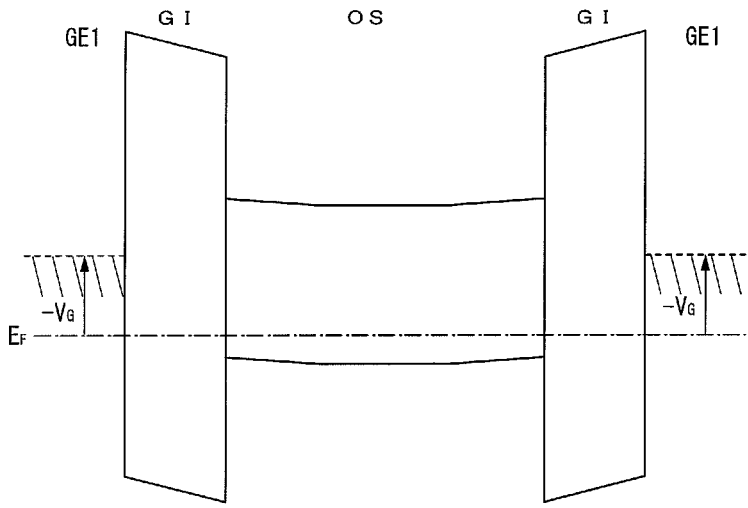

FIG. 8 is an energy band diagram (a schematic diagram) in a cross section taken along B-B' in FIG. 5 in the case where the gate voltage is 0 V. FIG. 9A illustrates a state where a positive potential (+$V_G$) is applied to a gate (G1), in other words, a case where the transistor is in an on-state where carriers (electrons) flow between a source and a drain. FIG. 9B illustrates a state where a negative potential (−$V_G$) is applied to the gate (G1), in other words, a case where the transistor is in an off-state.

Figure 7:
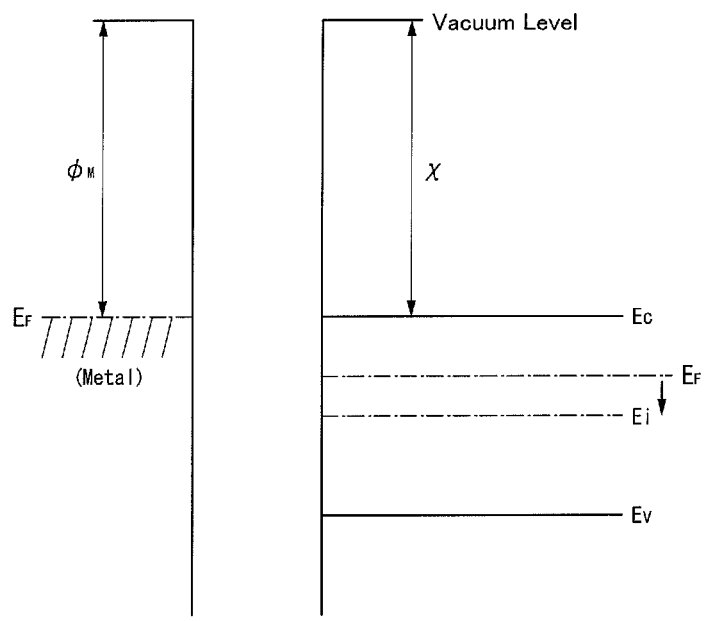
FIG. 7 shows relation between the vacuum level and the work function of a metal ($\phi_M$), and relation between the vacuum level and the electron affinity ($\chi$) of an oxide semiconductor.

FIG. 7 shows relation between the vacuum level and the work function of a metal ($\phi_M$) and relation between the vacuum level and the electron affinity ($\chi$) of an oxide semiconductor.

Free electrons in the metal degenerate, and the Fermi level is located in the conduction band. On the other hand, a conventional oxide semiconductor is typically an n-type semiconductor, in which case the Fermi level ($E^F$) is away from the intrinsic Fermi level ($E_i$) located in the middle of a band gap and is located closer to the conduction band. Note that it is known that part of hydrogen serves as a donor in an oxide semiconductor and is one factor causing an oxide semiconductor to be an n-type semiconductor.

In contrast, an oxide semiconductor of the present invention is an intrinsic (i-type) semiconductor or a substantially intrinsic semiconductor which is obtained by removing hydrogen that is an n-type impurity from an oxide semiconductor and highly-purifying the oxide semiconductor so that impurities that are not main components of the oxide semiconductor are prevented from being contained therein as much as possible. That is, the oxide semiconductor of this embodiment has a feature in that it is made to be an i-type (intrinsic) semiconductor or made to be close thereto by being highly purified by removal of impurities such as hydrogen or water as much as possible, instead of addition of impurities. This enables the Fermi level ($E_F$) to be at the same level as the intrinsic Fermi level ($E_i$).

In the case where the band gap ($E_g$) of an oxide semiconductor is 3.15 eV, the electron affinity ($\chi$) is said to be 4.3 eV. The work function of titanium (Ti) contained in the source electrode and the drain electrode is substantially equal to the electron affinity ($\chi$) of the oxide semiconductor. In that case, a Schottky barrier for electrons is not formed at an interface between the metal and the oxide semiconductor.

That is, in the case where the work function of metal ($\phi_M$) and the electron affinity ($\chi$) of the oxide semiconductor are equal to each other and the metal and the oxide semiconductor are in contact with each other, an energy band diagram (a schematic diagram) as illustrated in FIG. 6A is obtained.

In FIG. 6B, a black circle (•) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 6A where no voltage is applied, i.e., ½ of the band gap ($E_g$).

The thickness of the oxide semiconductor layer is greater than or equal to 1 μm, preferably greater than 3 μm, more preferably greater than or equal to 10 μm, and the intrinsic carrier density is low. Thus, in the state where a positive potential ($+V_G$) is applied to the gate (G1), as illustrated in FIG. 9A, the degree of curve of the band at a surface of the oxide semiconductor layer is small, the lower end of the conduction band approaches the Fermi level, and the entire oxide semiconductor layer is stable in terms of energy. Therefore, electrons flow more easily not only in the vicinity of the gate insulating film but also in the entire region of the oxide semiconductor; as a result, a channel is formed in the entire region of the oxide semiconductor and a larger amount of current can flow. In contrast, in the state where a negative potential ($-V_G$) is applied to the gate (G1), holes which are minority carriers are substantially zero, and the amount of current is extremely small; as a result, the value of current in a channel per unit area is lower than or equal to 100 aA/μm, preferably lower than or equal to 10 aA/μm, more preferably lower than or equal to 1 aA/μm, which is close to zero.

Next, the intrinsic carrier density of the oxide semiconductor will be described.

The intrinsic carrier density $n_i$ contained in a semiconductor is calculated by approximation of Fermi-Dirac distribution in accordance with Fermi-Dirac statics by the Boltzmann distribution formula (see Formula 1).

$$n_i = \sqrt{N_C N_V} \exp\left(-\frac{E_g}{2kT}\right) \quad \text{[Formula 1]}$$

The intrinsic carrier density $n_i$ obtained by the approximate expression is a relational expression of effective density of states in a conduction band $N_c$, effective density of states in a valence band $N_v$, and a band gap $E_g$. From Formula 1, the intrinsic carrier density $n_i$ of silicon is $1.4\times10^{10}$ cm$^{-3}$, and the intrinsic carrier density $n_i$ of an oxide semiconductor (an In—Ga—Zn—O film here) is $1.2\times10^{-7}$ cm$^{-3}$. It is found that the intrinsic carrier density of an oxide semiconductor is extremely low as compared with that of silicon.

Next, the width of a depletion layer and the Debye length in the case where a negative potential ($-V_G$) is applied to the gate (G1) will be described below.

When voltage is applied to a MOS transistor formed using a semiconductor having a donor density $N_d$, an insulator, and a metal, the maximum width of a depletion layer $T_{D\ MAX}$ formed in the semiconductor can be calculated by Formula 2.

$$T_{DMax} = \sqrt{\frac{2\varepsilon_S \varepsilon_0 (2\phi_F)}{qN_d}} \quad \text{[Formula 2]}$$

The maximum width of a depletion layer can be expressed as a functional of the donor density and a Fermi potential, and the Fermi potential $\phi_F$ can be calculated by Formula 3.

$$\phi_F = \frac{kT}{q}\ln\frac{N_d}{n_i} \quad \text{[Formula 3]}$$

The Debye length $L_D$ of the MOS transistor can be calculated by Formula 4.

$$L_D = \sqrt{\frac{\varepsilon_S \varepsilon_0 kT}{q^2 N_d}} \quad \text{[Formula 4]}$$

Note that $\varepsilon_s$, $\varepsilon_0$, $N_d$, q, k, and T respectively represent dielectric constant of an oxide semiconductor, permittivity of a vacuum, donor density, elementary electric charge, Boltzmann constant, and temperature.

Figure 10A:
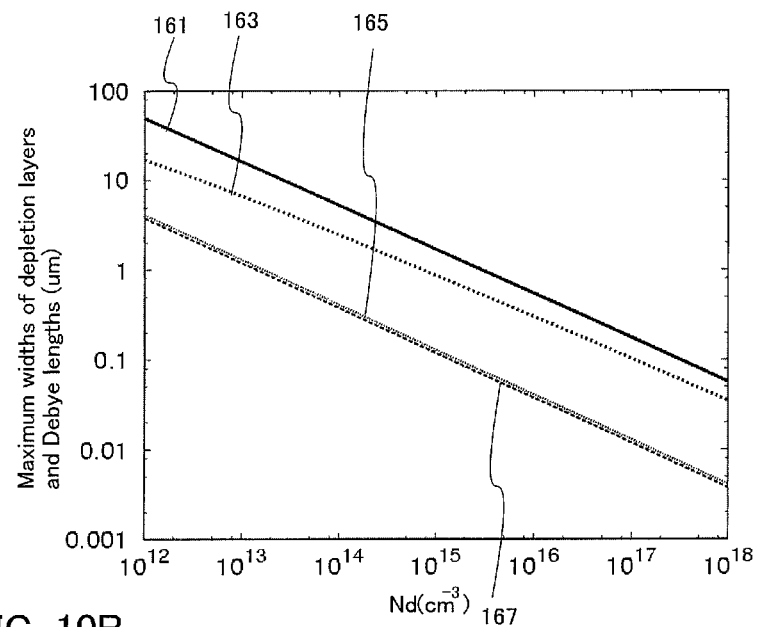
FIGS. 10A and 10B show calculation results of maximum widths of depletion layers and Debye lengths.
Figure 10B:
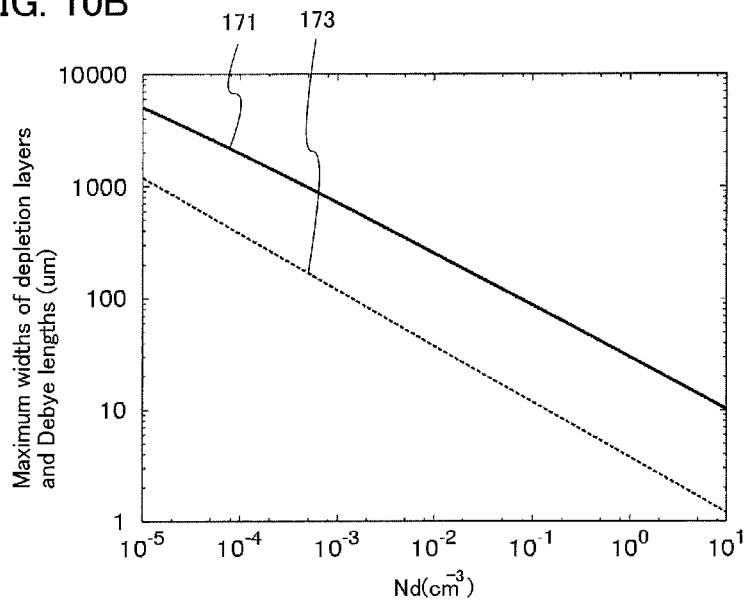

FIGS. 10A and 10B show results of calculation of the maximum width of a depletion layer and the Debye length of a MOS transistor using silicon and the maximum width of a depletion layer and the Debye length of a transistor using an oxide semiconductor when $n_i$ (intrinsic carrier density) of silicon, $\varepsilon_s$ thereof, $n_i$ of the oxide semiconductor, and $\varepsilon_s$ thereof are respectively set to $1.4\times10^{10}$ cm$^{-3}$, 11.9, $1.2\times10^{-7}$ cm$^{-3}$, and 10. Each of the transistors here used for the calculation has a horizontal MOS transistor structure in which a channel is formed in parallel to a surface of a substrate. Note that the maximum width of the depletion layer here corresponds to the width of the depletion layer that spreads perpendicular to the substrate. Note also that a depletion layer in a vertical MOS transistor spreads in a manner similar to that of the depletion layer in the horizontal transistor.

When silicon is used, the donor density corresponds to density of impurities (P). When an oxide semiconductor is used, oxygen deficiency and hydrogen serve as donors.

FIG. 10A shows the maximum widths of depletion layers and the Debye lengths of either the oxide semiconductor (also referred to as OS) or silicon (also referred to as Si) when the donor density is from $1\times10^{12}$ cm$^{-3}$ to $1\times10^{18}$ cm$^{-3}$. A thick solid line 161 represents the maximum width of a depletion layer of the oxide semiconductor, and a thick dashed line 163 represents the maximum width of a depletion layer of silicon. A thin solid line 165 represents the Debye length of the oxide semiconductor, and a thin dashed line 167 represents the Debye length of silicon.

FIG. 10B shows the maximum width and the Debye length of the oxide semiconductor when the donor density is from $1\times10^{-5}$ cm$^{-3}$ to $1\times10^{1}$ cm$^{-3}$. Note that this range of density is lower than the intrinsic carrier density of silicon ($n_i=1.4\times10^{10}$ cm$^{-3}$), so that only calculation results of the oxide semiconductor are shown. A thick solid line represents the maximum width of a depletion layer of the oxide semiconductor, and a thin solid line represents the Debye length of the oxide semiconductor.

From FIGS. 10A and 10B, it is found that the maximum width of a depletion layer is increased and the Debye length is increased as the donor density is decreased. It is also found that the maximum width of a depletion layer $T_{D\ MAX}$ depends on the intrinsic carrier density $n_i$ and that the depletion layer spreads more when the oxide semiconductor having lower $n_i$ is used than when silicon is used. It is also found that as the oxide semiconductor becomes closer to an i-type semiconductor from an n-type semiconductor, in other words, as the donor density ($N_d$) becomes lower, the maximum width of a depletion layer is drastically increased from several tens of micrometers to several thousands of micrometers, the Debye length is drastically increased from several micrometers to several hundreds of micrometers, and the depletion layer spreads in the entire region of the oxide semiconductor, as shown in FIG. 10B.

From the above, since the oxide semiconductor has a wide band gap and a low intrinsic carrier density, the maximum width of a depletion layer and the Debye length are increased, and the depletion layer spreads in the entire region of the oxide semiconductor in an off-state; as a result, the off-state current can be reduced to a value as close to zero as possible.

By highly-purifying the oxide semiconductor to make an intrinsic (i-type) semiconductor or a substantially intrinsic semiconductor so that impurities that are not main components of the oxide semiconductor are not contained as much as possible, the interface characteristics with a gate insulating film become noticeable. Therefore, the gate insulating film is preferably formed using a material that can form a favorable interface with the oxide semiconductor. For example, it is preferable to use a dense insulating film formed by a CVD method using high-density plasma generated with a power supply frequency in the range of the VHF band to the microwave band, or an insulating film formed by a sputtering method. Further, in order to obtain a favorable interface between the gate insulating film and a gate electrode, on a surface of the gate insulating film, a dense insulating film formed by a CVD method using high-density plasma generated with a power supply frequency in the range of the VHF band to the microwave band may be formed.

By highly-purifying an oxide semiconductor in this manner so that impurities that are not main components of the oxide semiconductor are not contained as much as possible, a transistor with high on-state current, a low off-state current, a high on/off ratio, and favorable operation characteristics can be manufactured.

Here, the drain withstand voltage of a transistor using an oxide semiconductor will be described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is 3.15 eV, which is larger than the band gap of silicon, 1.12 eV, the avalanche breakdown is expected to be unlikely to occur. Therefore, a transistor using the oxide semiconductor has a high drain withstand voltage, and an exponential sudden increase of on-state current is expected to be unlikely to occur when a high electric field is applied.

Next, hot-carrier degradation of a transistor using an oxide semiconductor will be described.

The hot-carrier degradation means deterioration of transistor characteristics, e.g., variation in the threshold voltage or a gate leakage, owing to a phenomenon that electrons that are accelerated to be rapid become a fixed charge by being injected in a gate oxide film in the vicinity of a drain in a channel, or a phenomenon that electrons that are accelerated to be rapid form a trap level at the interface between the gate insulating film and the oxide semiconductor film. The factors of the hot-carrier degradation are channel-hot-electron injection (CHE injection) and drain-avalanche-hot-carrier injection (DAHC injection).

Since the band gap of silicon is narrow, electrons are likely to be generated like an avalanche owing to an avalanche breakdown, and electrons that are accelerated to be so rapid as to go over a barrier to the gate insulating film are increased in number. However, the oxide semiconductor described in this embodiment has a wide band gap; therefore, the avalanche breakdown is unlikely to occur and resistance to the hot-carrier degradation is higher than that of silicon. Note that the band gap of silicon carbide which is one of materials having a high withstand voltage and the band gap of the oxide semiconductor are equal to each other; thus, the withstand voltage of the oxide semiconductor is expected to be as high as that of SiC.

From the above, a transistor using an oxide semiconductor has high drain withstand voltage; specifically, such a transistor can have drain withstand voltage of greater than or equal to 100 V, preferably greater than or equal to 500 V, more preferably greater than or equal to 1 kV.

Comparison between a transistor using silicon carbide, which is a typical example of a transistor, and a transistor using an oxide semiconductor will be described below. Here, 4H—SiC is used as the silicon carbide.

An oxide semiconductor and 4H—SiC have some things in common. One example is intrinsic carrier density. Using the Fermi-Dirac distribution at normal temperature, the intrinsic carrier density of the oxide semiconductor is estimated to approximately $10^{-7}$ cm$^{-3}$, which is extremely low like the carrier density of 4H—SiC, i.e., $6.7 \times 10^{-11}$ cm$^{-3}$.

In addition, the energy band gap of the oxide semiconductor is 3.0 eV to 3.5 eV and that of 4H—SiC is 3.26 eV, which means that both the oxide semiconductor and the silicon carbide are wide-gap semiconductors.

However, the manufacturing temperature of transistors using an oxide semiconductor and silicon carbide is largely different. Heat treatment for activation at 1500° C. to 2000° C. is needed in the case of using silicon carbide. In contrast, in the case of using an oxide semiconductor, an oxide semiconductor can be formed by heat treatment at 300° C. to 500° C. (lower than or equal to the glass transition temperature, and the maximum is approximately 700° C.), which allows a transistor to be manufactured over a large-sized substrate. In addition, throughput can be improved.

A manufacturing process of a SiC-MOSFET includes a step of doping with an impurity that can be a donor or an acceptor (e.g., phosphorus or boron) and a high-temperature heat treatment step for activation. Here, it is to be noted that an oxide semiconductor has a relatively high electron affinity. Accordingly, by selecting metal having an appropriate work function for an electrode, an ohmic contact can be formed between the oxide semiconductor and the electrode without a step of doping with an impurity in a manufacturing process of a transistor. In this manner, simplification of the process can be realized because an n$^+$ region is easily formed in the contact portion.

Note that considerable research has been done on properties of oxide semiconductors such as density of states (DOS) in the band gap; however, the research does not include the idea of sufficiently reducing the DOS itself. In this embodiment, a highly-purified oxide semiconductor is formed by removing water or hydrogen which might induce the DOS in the energy gap from the oxide semiconductor. This is based on the idea of sufficiently reducing the DOS itself. Thus, excellent industrial products can be manufactured.

Further, it is also possible to form a more highly-purified (i-type) oxide semiconductor by supplying oxygen to a dangling bond of metal which is generated by lack of oxygen and reducing the DOS due to oxygen deficiency. For example, an oxide film containing an excessive amount of oxygen is formed in close contact with a channel formation region and oxygen is supplied from the oxide film, whereby the DOS due to oxygen deficiency can be reduced.

It is said that a defect of the oxide semiconductor is caused by a shallow level of 0.1 eV to 0.2 eV below the conduction band due to excessive hydrogen, a deep level due to lack of oxygen, or the like. The technical idea that hydrogen is drastically reduced and oxygen is sufficiently supplied in order to eliminate such a defect would be right.

An oxide semiconductor is generally considered as an n-type semiconductor; however, in this embodiment, an i-type semiconductor is realized by removing an impurity, particularly water or hydrogen. In this respect, it can be said that one embodiment of the present invention includes a novel technical idea because it is different from an i-type semiconductor such as silicon doped with an impurity.

By making the oxide semiconductor be an i-type semiconductor, favorable temperature characteristics of the transistor can be obtained; typically, in terms of the current vs. voltage characteristics of the transistor, on-state current, off-state current, field-effect mobility, an S value, and a threshold voltage are hardly fluctuated at a temperature ranging from −25° C. to 150° C., and the current vs. voltage characteristics are hardly degraded by the temperature.

In the transistor using an oxide semiconductor which is described in this embodiment, mobility at a channel is a little lower than that in a transistor using silicon carbide; however, a current value and device characteristics of the transistor can be improved by increasing the drain voltage and the channel width (W).

A technical idea of this embodiment is that an impurity is not added to an oxide semiconductor and on the contrary the oxide semiconductor itself is highly purified by intentionally removing an impurity such as water or hydrogen which undesirably exists therein. In other words, the oxide semiconductor is highly purified by removing water or hydrogen which forms a donor level, reducing oxygen deficiency, and sufficiently supplying oxygen that is a main component of the oxide semiconductor.

When the oxide semiconductor is deposited, hydrogen at density of $10^{20}$ cm$^{-3}$ is measured using secondary ion mass spectrometry (SIMS). The oxide semiconductor is highly purified and made to be an i-type (intrinsic) semiconductor by intentionally removing water or hydrogen which forms a donor level and further by adding oxygen (one of components of the oxide semiconductor), which is reduced at the same time as removal of water or hydrogen, to the oxide semiconductor.

In this embodiment, the amount of water and hydrogen in the oxide semiconductor is preferably as small as possible, and the number of carriers in the oxide semiconductor is preferably as small as possible. In other words, carrier density of lower than $1 \times 10^{14}$ cm$^{-3}$, preferably lower than $1 \times 10^{12}$ cm$^{-3}$, more preferably lower than $1 \times 10^{11}$ cm$^{-3}$ which is lower than or equal to the measurement limit is desirable. Further, in the technical idea of this embodiment, an ideal carrier density is 0 or close to 0. Furthermore, in a transistor, an oxide semiconductor functions as a path in which carriers (electrons) supplied from a source flow by reducing or preferably eliminating carriers of the oxide semiconductor. As a result, the oxide semiconductor is an i-type (intrinsic) semiconductor that is highly-purified and that includes an extremely small number of or no carriers, and off-state current can be extremely small in the state where the transistor is in an off-state, which is the technical idea of this embodiment.

In addition, when the oxide semiconductor functions as a path, and the oxide semiconductor itself is an i-type (intrinsic) semiconductor which is highly purified so as to include an extremely small number of or no carriers, carriers are supplied from source and drain electrodes. The barrier height mainly contributes to the degree of supply as compared with the electron affinity χ of the oxide semiconductor, the Fermi level thereof, which ideally corresponds to the intrinsic Fermi level, and the work function of a material of the source or drain electrode.

On the other hand, a horizontal transistor in which a channel is formed substantially in parallel with a substrate needs a source and a drain as well as the channel, so that an area occupied by the transistor in the substrate is increased, which hinders miniaturization. However, a source, a channel, and a drain are stacked in a vertical transistor, whereby an occupation area in a substrate surface can be reduced. As a result, it is possible to miniaturize the transistor.

As described above, the oxide semiconductor film is highly purified so that an impurity that is not a main component of the oxide semiconductor film, typically hydrogen, water, hydroxy group, or hydride, may be contained as little as possible, whereby good operation of the transistor can be obtained. In particular, the withstand voltage can be increased, a short-channel effect can be suppressed, and an on/off ratio can be increased.

Embodiment 2

In this embodiment, a structure of a transistor with higher reliability and higher field-effect mobility than those in Embodiment 1 will be described with reference to FIGS. 2A and 2B and FIG. 3.

Figure 2A:
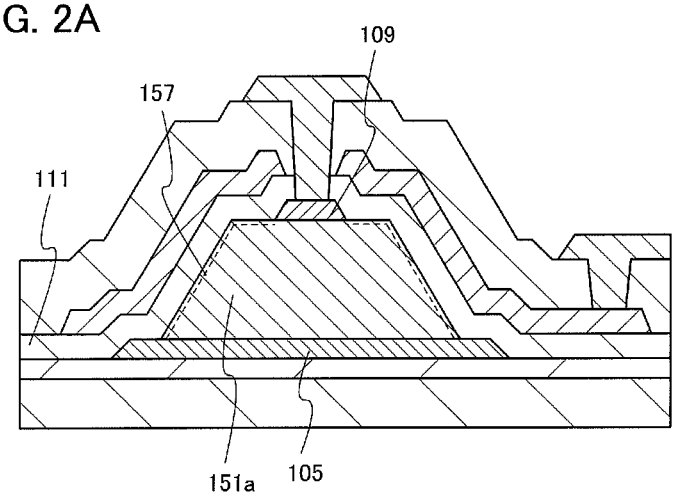
FIGS. 2A and 2B illustrate cross-sectional views of a transistor.
Figure 2B:
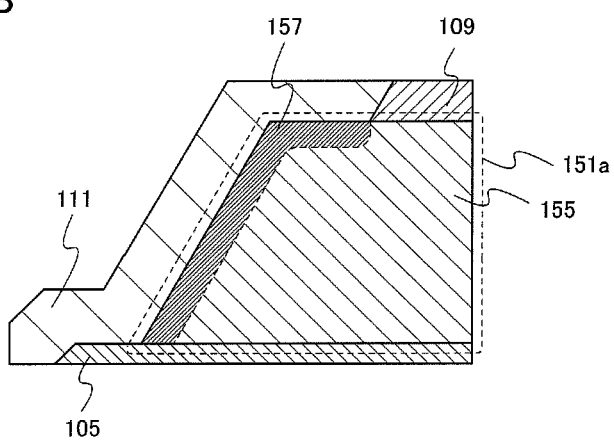

In this embodiment, an oxide semiconductor film 151a which is provided between a first electrode 105 and a second electrode 109 as illustrated in FIG. 2A includes a crystal region 157 in a superficial portion that is in contact with a gate insulating film 111. An enlarged view of the vicinity of the interface between the oxide semiconductor film 151a and the gate insulating film 111 is illustrated in FIG. 2B.

The oxide semiconductor film 151a includes an amorphous region 155 which mainly contains an amorphous oxide semiconductor and the crystal region 157 formed in the superficial portion of the oxide semiconductor film 151a. Note that the superficial portion indicates a region that is located at a distance (depth) from the top surface of 10% or less of the thickness of the oxide semiconductor film.

Note that the amorphous region 155 mainly contains an amorphous oxide semiconductor film. Note that the word "mainly" means, for example, a state where one occupies 50% or more of a region. In this case, it means a state where the amorphous oxide semiconductor film occupies 50% or more at volume % (or weight %) of the amorphous region 155. That is, the amorphous region in some cases includes crystals of an oxide semiconductor film other than an amorphous oxide semiconductor film, and the percentage of the content thereof is preferably less than 50% at volume % (or weight %). However, the percentage of the content is not limited to the above.

In the case where the In—Ga—Zn—O oxide semiconductor film is used as a material of the oxide semiconductor film, the composition of the above amorphous region 155 is preferably set so that a Zn content (atomic %) is larger than an In or Ga content (atomic %). With the use of such a composition, the crystal region 157 of a predetermined composition is easily formed.

In the crystals in the crystal region 157 in the superficial portion, the c-axis is oriented almost perpendicularly to the top surface of the oxide semiconductor film 151a, and the crystals are adjacent to each other. For example, in the case of using an In—Ga—Zn—O-based oxide semiconductor material, in the crystals in the crystal region 157, the c-axis of the crystals of InGaZnO$_4$ is oriented almost perpendicularly to the surface of the oxide semiconductor film 151a. Note that a "superficial portion (the vicinity of a surface)" means, for example, a region located at a distance (depth) from the surface of 20 nm or less.

Figure 3:
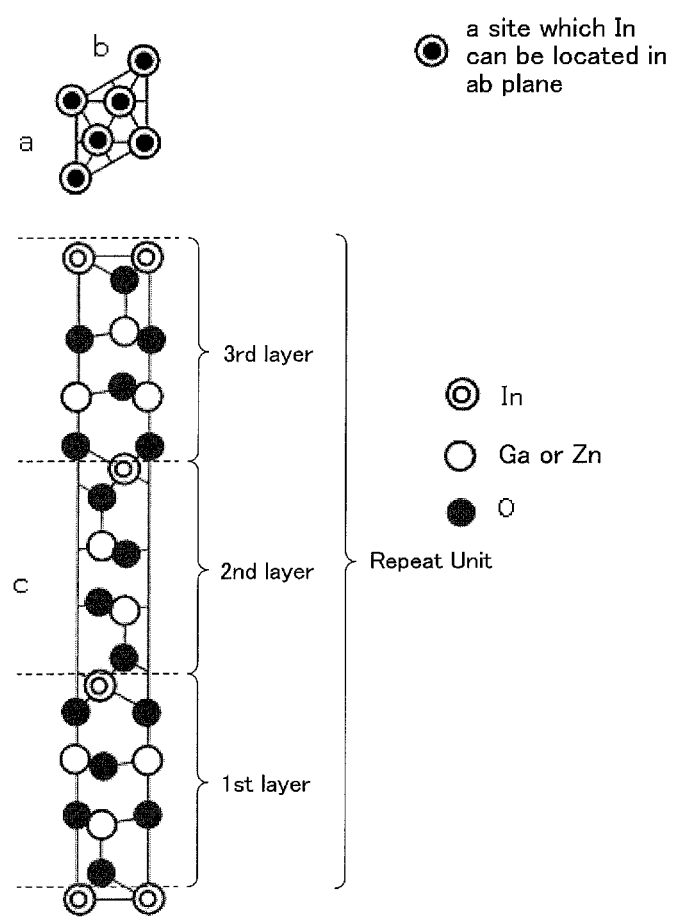
FIG. 3 illustrates a crystal structure of $InGaZnO_4$.

The crystals of InGaZnO$_4$ include any of 1n, Ga, and Zn, and can be considered to have a stacked structure of layers parallel to the a-axis and the b-axis (see FIG. 3). That is, the crystals of InGaZnO$_4$ have a structure in which a first layer containing In, a second layer containing In, and a third layer containing In are stacked in the c-axis direction.

Since electrical conductivity of the crystals of InGaZnO$_4$ is controlled mainly by In, electric characteristics of the first to the third layers each containing In which is related to a direction parallel to the a-axis and the b-axis are favorable. This is because the 5 s orbital of one of In overlaps with the 5 s orbital of an adjacent In in one or more of the first to the third layers each containing In, so that a carrier path is formed.

When such crystals are oriented, an effect on electric characteristics of the oxide semiconductor film 151a also arises. Specifically, for example, electric characteristics in a direction parallel to the top surface of the oxide semiconductor film 151a are improved. This is because the c-axis of the crystals of InGaZnO$_4$ is oriented almost perpendicularly to the surface of the oxide semiconductor film 151a, and current flows in a direction parallel to the a-axis and the b-axis in the crystals of InGaZnO$_4$.

The crystal structure of the crystal region 157 is not limited to the above structure, and the crystal region 157 may include crystals of another structure. For example, in the case of using an In—Ga—Zn—O-based oxide semiconductor material, crystals of In$_2$Ga$_2$ZnO$_7$, InGaZn$_5$O$_8$, or the like may be included in addition to the crystals of InGaZnO$_4$. Needless to say, the case where crystals of InGaZnO$_4$ exist in the entire crystal region 157 is more effective and more preferable.

As described above, when the oxide semiconductor film 151a has the crystal region 157 in the superficial portion, favorable electric characteristics can be achieved. In particular, in the case where the crystal region 157 contains the crystals of InGaZnO$_4$ in which the c-axis is oriented almost perpendicularly to the top surface of the oxide semiconductor film 151a, the carrier mobility in the superficial portion of the oxide semiconductor film 151a is increased owing to electric characteristics of the crystals of InGaZnO$_4$. Thus, the field-effect mobility of a transistor including the oxide semiconductor film 151a is increased, and favorable electric characteristics can be achieved.

Further, the crystal region 157 is more stable than the amorphous region 155; therefore, when the crystal region 157 is included in the superficial portion of the oxide semiconductor film 151a, the entry of impurities (e.g., hydrogen, water, hydroxy group, hydride, or the like) into the amorphous region 155 can be reduced. Thus, the reliability of the oxide semiconductor film 151a can be increased.

Through the above-described steps, the concentration of hydrogen in the oxide semiconductor film can be reduced and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which hydrogen concentration is reduced and which is highly purified, it is possible to manufacture a transistor with a high withstand voltage, a high resistance to a short-channel effect, and a high on/off ratio.

This embodiment can be implemented in combination with any of the structures described in the other embodiments as appropriate.

Embodiment 3

In this embodiment, a structure of a transistor with higher reliability and higher field-effect mobility than those in Embodiment 1 will be described with reference to FIGS. 4A to 4C.

Figure 4A:
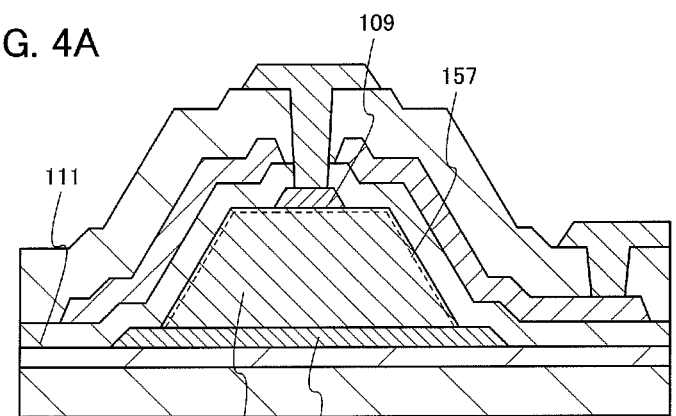
FIGS. 4A to 4C illustrate cross-sectional views of transistors.

In this embodiment, an oxide semiconductor film which is provided between a first electrode 105 and a second electrode 109 as illustrated in FIG. 4A includes a crystal region 157 in a superficial portion that is in contact with a gate insulating film 111 and a second electrode 109. An enlarged view of the vicinity of oxide semiconductor films 151b and 151c is illustrated in FIGS. 4B and 4C.

Figure 4B:
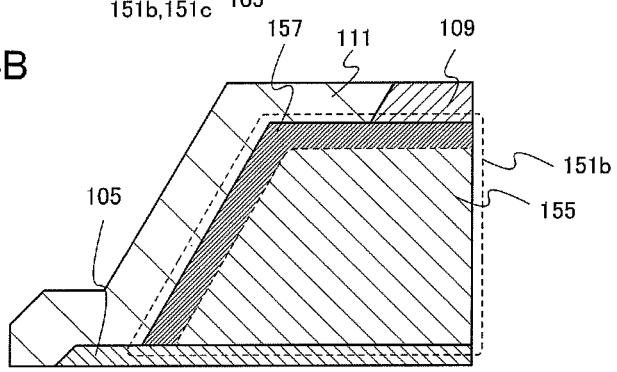

In FIG. 4B, the oxide semiconductor film 151b includes a crystal region 157 in a superficial portion that is in contact with the gate insulating film 111 and the second electrode 109.

Figure 4C:
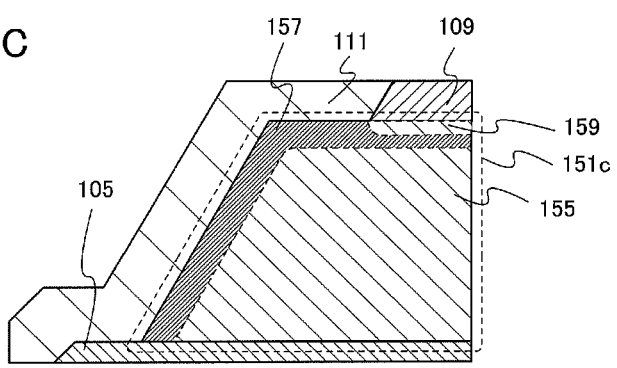

In FIG. 4C, the oxide semiconductor film 151c includes a crystal region 157 in a region that is in contact with the gate insulating film 111 and a region that is apart from the second electrode 109 at a certain distance. Note that the oxide semiconductor film 151c includes an amorphous region 159 in a region that is in contact with the second electrode 109.

In the crystal region 157 in this embodiment, as in the crystal region 157 described in Embodiment 2, the c-axis is oriented almost perpendicularly to the top surface of the oxide semiconductor films 151b and 151c. Therefore, electric characteristics in a direction parallel to the top surfaces of the oxide semiconductor films 151b and 151c are improved. From the above, the field-effect mobility of a transistor including the oxide semiconductor films 151b and 151c is increased, and favorable electric characteristics can be achieved.

This embodiment can be implemented in combination with any of the structures described in the other embodiments as appropriate.

Embodiment 4

In this embodiment, transistors with high heat resistance will be described with reference to FIGS. 1A and 1B.

By using a substrate having a high heat-dissipation property as the substrate 101 illustrated in FIGS. 1A and 1B, a transistor with high heat resistance can be manufactured. Examples of the substrate having a high heat-dissipation property include a semiconductor substrate, a metal substrate, a plastic substrate, and the like. As typical examples of the semiconductor substrate, a single crystal semiconductor substrate such as a silicon substrate or a silicon carbide substrate, a polycrystalline semiconductor substrate, a compound semiconductor substrate such as a silicon germanium substrate, and the like can be given. As typical examples of the metal substrate, an aluminum substrate, a copper substrate, a stainless steel substrate, and the like can be given. As a typical example of the plastic substrate, a plastic substrate containing a carbon fiber, a metal fiber, a metal piece, or the like can be given. Note that the semiconductor substrate, the metal substrate, and the plastic substrate are not limited to the above substrates, and any substrate can be used as appropriate as long as it has a high heat-dissipation property.

By using an insulating film having high thermal conductivity as the insulating film 103 illustrated in FIGS. 1A and 1B, a transistor with high heat resistance can be manufactured. Examples of the insulating film having high thermal conductivity include an aluminum nitride film, an aluminum nitride oxide film, a silicon nitride film, and the like.

A semiconductor film may be formed between the first electrode 105 and the insulating film 103 illustrated in FIGS. 1A and 1B. As typical examples of the semiconductor film, a silicon film, a germanium film, a silicon carbide film, a diamond like carbon (DLC) film, and the like can be given.

Note that by using one or more of the above components, a transistor with high heat resistance can be manufactured.

This embodiment can be implemented in combination with any of the structures described in the other embodiments as appropriate.

Embodiment 5

In this embodiment, a transistor including a first electrode 105 and a second electrode 109 that are formed using materials having different work functions will be described.

In this embodiment, one of the first electrode 105 and the second electrode 109 is formed using a conductive material having a work function that is lower than or equal to the electron affinity of an oxide semiconductor, and the other of the first electrode 105 and the second electrode 109 is formed using a conductive material having a work function that is higher than the electron affinity of the oxide semiconductor.

For example, in the case where the electron affinity ($\chi$) of the oxide semiconductor is 4.3 eV, as the conductive material having a work function that is higher than the electron affinity of the oxide semiconductor, tungsten (W), molybdenum (Mo), chromium (Cr), iron (Fe), indium tin oxide (ITO), or the like can be used. As the conductive material having a work function that is lower than or equal to the electron affinity of the oxide semiconductor, titanium (Ti), yttrium (Y), aluminum (Al), magnesium (Mg), silver (Ag), zirconium (Zr), or the like can be used.

First, described is a case where an electrode functioning as a drain is formed using a conductive material having a work function that is higher than the electron affinity of the oxide semiconductor, and an electrode functioning as a source is formed using a conductive material having a work function that is lower than or equal to the electron affinity of the oxide semiconductor.

The relation between the work function of the conductive material for forming the electrode functioning as a drain $\phi_{md}$, the work function of the conductive material for forming the electrode functioning as a source $\phi_{ms}$, and the electron affinity $\chi$ is set so as to be expressed as Formula 5.

$$\phi_{ms} \leq \chi < \phi_{md} \quad \text{(Formula 5)}$$

As can be seen, the work function of the conductive material of the electrode functioning as a source is lower than or equal to the electron affinity of the oxide semiconductor; therefore, a barrier in an on-state of the transistor (for example, h in FIG. 6B) can be reduced, the on-state is realized at a low gate voltage, and a large amount of current can flow.

In another case, the relation between the work function $\phi_{md}$, the electron affinity $\chi$, and the work function $\phi_{ms}$ is set so as to be expressed as Formula 6.

$$\phi_{md} \leq \chi < \phi_{ms} \quad \text{(Formula 6)}$$

As can be seen, since the work function of the conductive material of the electrode functioning as a source is higher than the electron affinity of the oxide semiconductor, the barrier of the transistor becomes high. Accordingly, the amount of current in an off-state can be reduced.

Note that the electrode functioning as a source can be one of the first electrode 105 and the second electrode 109, and the electrode functioning as a drain can be the other of the first electrode 105 and the second electrode 109.

From the above, by forming one of the first electrode 105 and the second electrode 109 using a conductive material having a work function that is lower than or equal to the electron affinity of the oxide semiconductor and by forming the other of the first electrode 105 and the second electrode 109 using a conductive material having a work function that is higher than the electron affinity of the oxide semiconductor, on-state characteristics or off-state characteristics of a transistor can be improved.

This embodiment can be implemented in combination with any of the structures described in the other embodiments as appropriate.

Embodiment 6

In this embodiment, a manufacturing process of the transistor illustrated in FIGS. 1A and 1B or the transistor illustrated in FIGS. 2A and 2B will be described with reference to FIGS. 11A to 11C.

Figure 11A:
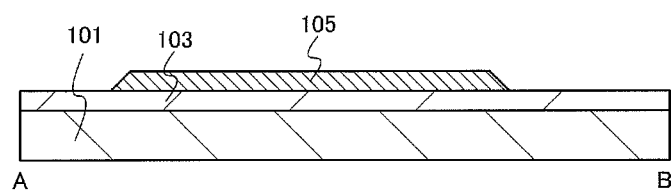
FIGS. 11A to 11C illustrate cross-sectional views for describing a method for manufacturing a transistor.

As illustrated in FIG. 11A, an insulating film 103 is formed over a substrate 101, and a first electrode 105 is formed over the insulating film 103. The first electrode 105 functions as one of a source electrode and a drain electrode of the transistor.

The insulating film 103 can be formed by a sputtering method, a CVD method, a coating method, or the like.

Note that when the insulating film 103 is formed by a sputtering method, the insulating film 103 is preferably formed in the state where hydrogen, water, hydroxy group, hydride, or the like remaining in a treatment chamber is removed. This is for preventing hydrogen, water, hydroxy group, hydride, or the like from being contained in the insulating film 103. An entrapment vacuum pump is preferably used for removing hydrogen, water, hydroxy group, hydride, or the like remaining in the treatment chamber. For example, a cryopump, an ion pump, or a titanium sublimation pump is preferably used as the entrapment vacuum pump. The evacuation unit can be a turbo pump provided with a cold trap. Since hydrogen, water, hydroxy group, hydride, or the like is evacuated in the treatment chamber which is evacuated using a cryopump, in the insulating film 103 formed in the treatment chamber, the concentration of impurities contained in the insulating film 103 can be reduced.

As a sputtering gas used for formation of the insulating film 103, a high-purity gas from which impurities such as hydrogen, water, hydroxy group, or hydride are removed to such a level that the impurity concentration is represented by the unit "ppm" or "ppb".

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. The RF sputtering method is mainly used in the case where an insulating film is formed, and the DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or films of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a sputtering method, a reactive sputtering method in which a target substance and a sputtering gas component are chemically reacted with each other during deposition to form a thin compound film thereof, or a bias sputtering method in which voltage is also applied to a substrate during deposition can be used.

As the sputtering in this specification, the above-described sputtering device and the sputtering method can be employed as appropriate.

In this embodiment, the substrate 101 is transferred to the treatment chamber. A sputtering gas containing high-purity oxygen, from which hydrogen, water, hydroxy group, hydride, or the like is removed, is introduced into the treatment chamber, and a silicon oxide film is formed as the insulating film 103 over the substrate 101 using a silicon target. Note that when the insulating film 103 is formed, the substrate 101 may be heated.

For example, a silicon oxide film is formed with an RF sputtering method under the following condition: quartz (preferably, synthetic quartz) is used; the substrate temperature is 108° C.; the distance between the substrate and the target (the T-S distance) is 60 mm; the pressure is 0.4 Pa; the high frequency power is 1.5 kW; and the atmosphere is an atmosphere containing oxygen and argon (an oxygen flow rate of 25 sccm: an argon flow rate of 25 sccm=1:1). The film thickness may be 100 nm. Note that instead of quartz (preferably, synthesized quartz), a silicon target can be used. Note that oxygen or a mixed gas of oxygen and argon is used as a sputtering gas.

For example, when the insulating film 103 is formed using a stacked structure, a silicon nitride film is formed using a silicon target and a sputtering gas containing high-purity nitrogen from which hydrogen, water, hydroxy group, hydride, or the like is removed, between the silicon oxide film and the substrate. Also in this case, as in the case of the silicon oxide film, it is preferable to form a silicon nitride film in the state where hydrogen, water, hydroxy group, hydride, or the like remaining in the treatment chamber is removed. Note that in the process, the substrate 101 may be heated.

In the case where a silicon nitride film and a silicon oxide film are stacked as the insulating film 103, the silicon nitride film and the silicon oxide film can be formed in the same treatment chamber with the use of a common silicon target. First, the silicon nitride film is formed in such a manner that a sputtering gas containing nitrogen is introduced and a silicon target mounted on the treatment chamber is used. Then, the silicon oxide film is formed in such a manner that the gas is switched to a sputtering gas containing oxygen and the same silicon target is used. The silicon nitride film and the silicon oxide film can be formed successively without exposure to the air; thus, adsorption of impurities such as hydrogen, water, hydroxy group, or hydride on a surface of the silicon nitride film can be prevented.

The first electrode 105 can be formed in such a manner that a conductive film is formed over the substrate 101 by a sputtering method, a CVD method, or a vacuum evaporation method, a resist mask is formed over the conductive film in a photolithography step, and the conductive film is etched using the resist mask. Alternatively, the first electrode 105 is formed by a printing method or an ink-jet method without using a photolithography step, so that the number of steps can be reduced. Note that end portions of the first electrode 105 preferably have a tapered shape, so that the coverage with a gate insulating film to be formed later is improved. When the angle formed between the end portion of the first electrode 105 and the insulating film 103 is greater than or equal to 30° and less than or equal to 60° (preferably, greater than or equal to 40° and less than or equal to 50°), the coverage with the gate insulating film to be formed later can be improved.

In this embodiment, as the conductive film to serve as the first electrode 105, a titanium film is formed to a thickness of 50 nm by a sputtering method, an aluminum film is formed to a thickness of 100 nm, and a titanium film is formed to a thickness of 50 nm. Next, etching is performed using the resist mask formed in the photolithography step, whereby the first electrode 105 is formed.

Figure 11B:
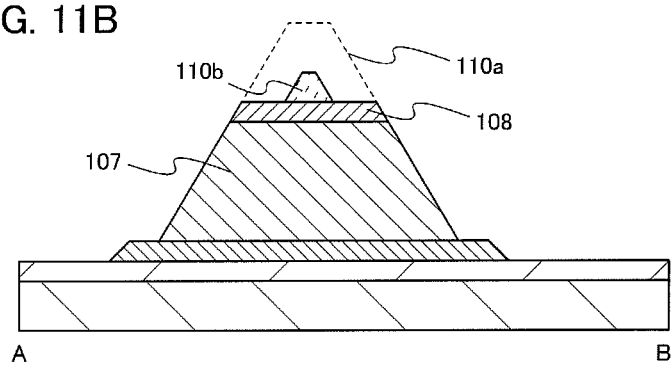

Next, as illustrated in FIG. 11B, the oxide semiconductor film 107 and a conductive film 108 to serve as the second electrode are formed over the first electrode 105. The oxide semiconductor film 107 functions as a channel formation region of the transistor.

Here, a method for forming the oxide semiconductor film 107 and the conductive film 108 to serve as the second electrode will be described.

An oxide semiconductor film is formed by a sputtering method, a coating method, a printing method, or the like over the substrate 101 and the first electrode 105. Next, a conductive film is formed over the oxide semiconductor film. In this embodiment, the oxide semiconductor film is formed by a sputtering method.

In order that hydrogen is contained as little as possible in the oxide semiconductor film 107, it is preferable that the substrate 101 over which the first electrode 105 is formed be preheated in a preheating chamber of the sputtering apparatus, so that impurities such as hydrogen, water, hydroxy group, or hydride adsorbed onto the substrate 101 are eliminated and exhausted, as a pretreatment. Note that a cryopump is preferable as an evacuation unit provided for the preheating chamber. Note that this preheating treatment can be omitted. In addition, this preheating may be performed on the substrate 101 before the formation of a gate insulating film 111 formed later, or may be performed on the substrate 101 before the formation of a third electrode 113 formed later.

Note that before the oxide semiconductor film is formed by a sputtering method, reverse sputtering in which plasma is generated by introduction of an argon gas is preferably performed and particles attached to the surface of the first electrode 105 are removed, so that resistance at the interface between the first electrode 105 and the oxide semiconductor film can be reduced. The reverse sputtering refers to a method in which without application of voltage to the target side, a high frequency power source is used for application of voltage to the substrate side in an argon atmosphere so that plasma is generated to modify a surface of the substrate. Note that instead of an argon atmosphere, a nitrogen atmosphere, a helium atmosphere, or the like may be used.

In this embodiment, the oxide semiconductor film is formed by a sputtering method with the use of an In—Ga—Zn—O-based metal oxide target. The oxide semiconductor film can be formed by a sputtering method in a rare gas (typically, argon) atmosphere, an oxygen atmosphere, or an atmosphere including a rare gas (typically, argon) and oxygen. In the case of using a sputtering method, a target including $SiO_2$ at higher than or equal to 2 wt % and lower than or equal to 10 wt % may be used.

As a sputtering gas used for formation of the oxide semiconductor film, a high-purity gas from which impurities such as hydrogen, water, hydroxy group, or hydride are removed to such a level that the impurity concentration is represented by the unit "ppm" or "ppb".

As a target for forming the oxide semiconductor film by a sputtering method, a target of metal oxide which contains zinc oxide as its main component can be used. As another example of the metal oxide target, a metal oxide target containing In, Ga, and Zn (composition ratio: $In_2O_3:Ga_2O_3:ZnO=1:1:1$ [molar ratio]) can be used. Alternatively, as a metal oxide target containing In, Ga, and Zn, a target having such composition ratio as In:Ga:Zn=1:1:2 [atomic ratio] or In:Ga:Zn=1:1:4 [atomic ratio] can be used. The filling factors of the metal oxide target is greater than or equal to 90% and less than or equal to 100%, preferably, greater than or equal to 95% and less than or equal to 99.9%. By using the metal oxide target with high filling factors, a dense oxide semiconductor film is formed.

The oxide semiconductor film is formed over the substrate 101 in such a manner that the substrate is held in a treatment chamber kept in a reduced pressure state, moisture remaining in the treatment chamber is removed, a sputtering gas from which hydrogen, water, hydroxy group, hydride, or the like is removed is introduced, and a metal oxide is used as a target. An entrapment vacuum pump is preferably used for removing hydrogen, water, hydroxy group, hydride, or the like remaining in the treatment chamber. For example, a cryopump, an ion pump, or a titanium sublimation pump is preferably used. The evacuation unit may be a turbo pump provided with a cold trap. For example, hydrogen, water, hydroxy group, hydride, or the like (more preferably, including a compound containing a carbon atom) is exhausted from a treatment chamber with the use of a cryopump. Therefore, the concentration of impurities contained in the oxide semiconductor film formed in this chamber can be lowered. The oxide semiconductor film may be formed in the state where the substrate is heated.

In this embodiment, as an example of the film formation condition of the oxide semiconductor film, the following condition is employed: the temperature of the substrate is room temperature; the distance between the substrate and the target is 110 mm; the pressure is 0.4 Pa; the direct current (DC) power is 0.5 kW; and the atmosphere is oxygen and argon (the flow rate ratio of oxygen to argon is 15 sccm:30 sccm). Note that a pulsed direct-current (DC) power source is preferably used, in which case powder substances (also referred to as particles or dust) that are formed in film formation can be reduced and the film thickness can be uniform. The thickness of the oxide semiconductor film is greater than or equal to 1 μm, preferably greater than 3 μm, more preferably greater than or equal to 10 μm. Note that the preferable thickness varies depending on an oxide semiconductor film material; thus, the appropriate thickness may be determined depending on a material.

The conductive film 108 to serve as the second electrode can be formed using the material and the method which are used for the first electrode 105, as appropriate. Here, as the conductive film 108 to serve as the second electrode, a 50-nm-thick titanium film, a 100-nm-thick aluminum film, and a 50-nm-thick titanium film are stacked in that order.

Next, a resist mask is formed over the conductive film in a photolithography step, the conductive film 108 to serve as the second electrode and the oxide semiconductor film to serve as the oxide semiconductor film 107 are etched using the resist mask, whereby the island-shaped conductive film 108 to serve as second electrode and the island-shaped oxide semiconductor film 107 are formed. By forming a resist mask using an ink-jet method instead of the resist mask formed in the photolithography step, so that the number of steps can be reduced. It is preferable that the angle formed between a surface of the first electrode 105 and the end portions of the conductive film 108 to serve as the second electrode and the oxide semiconductor film 107 be greater than or equal to 30° and less than or equal to 60°, preferably greater than or equal to 40° and less than or equal to 50° owing to the etching, so that the coverage with a gate insulating film to be formed later can be improved.

Note that the etching of the conductive film and the oxide semiconductor film here may be performed by dry etching, wet etching, or both wet etching and dry etching. In order to form the oxide semiconductor film 107 and the conductive film 108 to serve as the second electrode each with a desired shape, the etching conditions (an etchant, etching time, temperature, and the like) are adjusted as appropriate depending on the material.

When the etching rate of each of the conductive film 108 to serve as the second electrode and the oxide semiconductor film is different from that of the first electrode 105, a condition such that the etching rate of the first electrode 105 is low and the etching rate of each of the conductive film 108 to serve as the second electrode and the oxide semiconductor film is high is selected. Alternatively, when a condition such that the etching rate of the oxide semiconductor film is low and the etching rate of the conductive film 108 is high is selected, the conductive film 108 is etched; then, a condition such that the etching rate of the first electrode 105 is low and the etching rate of the oxide semiconductor film is high is selected.

As an etchant used for wet etching of the oxide semiconductor film, a mixed solution of phosphoric acid, acetic acid, and nitric acid, an ammonia hydrogen peroxide mixture (hydrogen peroxide:ammonia water:water=5:2:2), or the like can be used. In addition, ITO07N (produced by KANTO CHEMICAL CO., INC.) may also be used.

The etchant after the wet etching is removed together with the etched materials by cleaning. The waste liquid including the etchant and the material etched off may be purified and the material may be reused. Materials such as indium contained in the oxide semiconductor film are collected from the waste liquid after the etching and recycled, so that resources can be effectively used and cost can be reduced.

As an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, the conductive film 108 to serve as the second electrode is etched using an ammonia hydrogen peroxide mixture as an etchant, and then the oxide semiconductor film is etched using a solution in which phosphoric acid, acetic acid, and nitric acid are mixed, whereby the oxide semiconductor film 107 is formed.

Next, the resist mask (indicated by a dashed line 110a) used for formation of the oxide semiconductor film 107 and the conductive film 108 to serve as the second electrode is recessed, so that a resist mask 110b is formed (see FIG. 11B). Here, the resist mask is subjected to ashing to form the resist mask 110b. Next, by using the resist mask 110b, the conductive film 108 is etched, whereby a second electrode 109 is formed (see FIG. 11C). The second electrode 109 functions as the other of the source electrode and the drain electrode of the transistor.

A method for etching the conductive film 108 is selected so that the etching rate of the first electrode 105 and the oxide semiconductor film 107 is low and the etching rate of the conductive film 108 is high.

Next, in this embodiment, first heat treatment is performed. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, and heat treatment is performed on the oxide semiconductor film in an inert gas atmosphere, such as a nitrogen atmosphere or a rare gas atmosphere, at 450° C. for one hour, and then the oxide semiconductor film is not exposed to air. Accordingly, hydrogen, water, hydroxy group, hydride, or the like can be prevented from being mixed into the oxide semiconductor film, hydrogen concentration is reduced, and the oxide semiconductor film is highly purified, whereby an i-type oxide semiconductor film or a substantially i-type oxide semiconductor film can be obtained. That is, at least one of dehydration and dehydrogenation of the oxide semiconductor film 107 can be performed by this first heat treatment.

Note that in the first heat treatment, it is preferable that hydrogen, water, hydroxy group, hydride, or the like be not contained in nitrogen or a rare gas such as helium, neon, or argon. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

Depending on conditions of the first heat treatment or materials for the oxide semiconductor film, the oxide semiconductor film remains uncrystallized and the oxide semiconductor film 107 illustrated in FIG. 1B is formed. One of such conditions is a heating temperature of higher than or equal to 400° C. and lower than 550° C., preferably higher than or equal to 400° C. and lower than 500° C. In the case of an In—Ga—Zn—O-based oxide semiconductor which is deposited by a sputtering method, one of the conditions is that a target in which ratio of a Zn content (atomic %) to an In content (atomic %) and to a Ga content (atomic %) is less than 1 (typically, In:Ga:Zn=1:1:0.5), so that the oxide semiconductor film is not crystallized and becomes the oxide semiconductor film 107 illustrated in FIG. 1B.

Other conditions of the first heat treatment or materials for the oxide semiconductor film cause crystallization of the oxide semiconductor film and an oxide semiconductor film including crystals is formed. For example, an oxide semiconductor film including crystals with a crystallinity of 90% or higher, or 80% or higher, is formed in some cases.

Depending on conditions of the first heat treatment or materials for the oxide semiconductor film, the oxide semiconductor film has a crystal region in a superficial portion of an amorphous oxide semiconductor film. One of such conditions is a heating temperature of higher than or equal to 500° C. and lower than or equal to 750° C., preferably higher than or equal to 550° C. and lower than the strain point of the substrate. In the case of an In—Ga—Zn—O-based oxide semiconductor which is deposited by a sputtering method, one of the conditions is that a target in which ratio of a Zn content (atomic %) to an In content (atomic %) and to a Ga content (atomic %) is greater than or equal to 1 (typically, In:Ga:Zn=1:1:1), so that the oxide semiconductor film 151a having a crystal region 157 in a superficial portion of the oxide semiconductor film is formed as illustrated in FIG. 2B.

In addition, the first heat treatment for the oxide semiconductor film may be performed on the oxide semiconductor film before being processed into the island-shaped oxide semiconductor film. In that case, the substrate is taken out from the heat apparatus after the first heat treatment, and then a photolithography step is performed.

Note that the heat treatment which has an effect of dehydration or dehydrogenation on the oxide semiconductor film may be performed after the oxide semiconductor film is formed; after the conductive film to serve as the second electrode is stacked over the oxide semiconductor film; after the gate insulating film is formed over the first electrode, the oxide semiconductor film, and the second electrode; or after the gate electrode is formed.

Figure 12A:
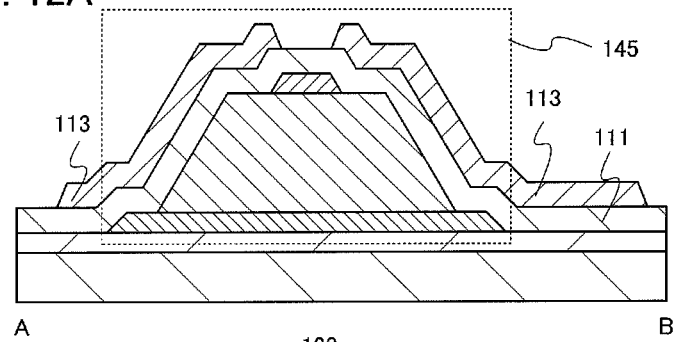
FIGS. 12A to 12C illustrate cross-sectional views for describing the method for manufacturing a transistor.

Next, as illustrated in FIG. 12A, the gate insulating film 111 is formed over the first electrode 105, the oxide semiconductor film 107, and the second electrode 109, and the third electrode 113 functioning as a gate electrode is formed over the gate insulating film 111.

An oxide semiconductor film (a highly-purified oxide semiconductor film in which hydrogen concentration is reduced) which is made to be an i-type semiconductor or a substantially i-type semiconductor by removal of impurities is highly sensitive to an interface state and interface charge; thus, an interface between the oxide semiconductor film and the gate insulating film 111 is important. Therefore, the gate insulating film 111 which is in contact with the highly-purified oxide semiconductor film needs high quality.

For example, high-density plasma CVD with use of microwaves (2.45 GHz) is preferably employed because formation of a dense and high-quality insulating film having high withstand voltage is possible. This is because when the highly-purified oxide semiconductor film in which hydrogen concentration is reduced is closely in contact with the high-quality gate insulating film, the interface state can be reduced and interface properties can be favorable.

Needless to say, as long as an insulating film that is favorable as a gate insulating film can be formed, other film formation methods such as a sputtering method and a plasma CVD method can be employed. A gate insulating film whose film quality is improved by the heat treatment after the gate insulating film is formed, or an insulating film whose characteristics of an interface with the oxide semiconductor film are improved may be used. In any case, any insulating film may be used as long as the insulating film has characteristics of enabling reduction in interface state density of an interface between the insulating film and the oxide semiconductor film and formation of a favorable interface as well as having favorable film quality as a gate insulating film.

In a gate bias-temperature stress test (BT test) at 85° C., at $2 \times 10^6$ V/cm for 12 hours, when impurities are added to the oxide semiconductor film, bonds between impurities and a main component of the oxide semiconductor film are cut by an intense electric field (B: bias) and high temperature (T: temperature), and generated dangling bonds cause a drift of threshold voltage ($V_{th}$).

In contrast, the present invention makes it possible to obtain a transistor which is stable to a BT test by removing impurities as much as possible in an oxide semiconductor film, especially hydrogen, water, and the like to obtain a favorable characteristic of an interface between the oxide semiconductor film and a gate insulating film as described above.

Note that when the gate insulating film 111 is formed by sputtering, the concentration of hydrogen in the gate insulating film 111 can be lowered. In the case where a silicon oxide film is formed by sputtering, a silicon target or a quartz target is used as a target and oxygen or a mixed gas of oxygen and argon is used as a sputtering gas.

Note that a halogen element (e.g. fluorine or chlorine) may be contained in an insulating film provided in contact with the oxide semiconductor film, or a halogen element may be contained in an oxide semiconductor film by plasma treatment in a gas atmosphere containing a halogen element in a state that the oxide semiconductor film is exposed, whereby impurities such as hydrogen, water, hydroxy group, or hydride (also referred to as hydrogen compounds) that can exist in the oxide semiconductor film or at the interface between the oxide semiconductor film and the insulating film which is provided in contact with the oxide semiconductor film may be removed. When the insulating film contains a halogen element, the halogen element concentration in the insulating film may be approximately $5 \times 10^{18}$ cm$^{-3}$ to $1 \times 10^{20}$ cm$^{-3}$.

As described above, in the case where a halogen element is contained in the oxide semiconductor film or at the interface between the oxide semiconductor film and the insulating film which is in contact with the oxide semiconductor film and the insulating film which is provided in contact with the oxide semiconductor film is an oxide insulating film, the oxide insulating film on the side where the oxide semiconductor film is not in contact with the oxide insulating film is preferably covered with a nitrogen insulating film. That is, a silicon nitride film or the like may be provided on and in contact with the oxide insulating film which is in contact with the oxide semiconductor film. With such a structure, entry of impurities such as hydrogen, water, hydroxy group, or hydride to the oxide insulating film can be reduced.

The gate insulating film 111 can have a structure in which a silicon oxide film and a silicon nitride film are stacked in that order over the first electrode 105, the oxide semiconductor film 107, and the second electrode 109. For example, a gate insulating film having a total thickness of 100 nm may be formed in such a manner that a silicon oxide film (SiO$_x$ (x>0)) with a thickness of greater than or equal to 5 nm and less than or equal to 300 nm is formed as a first gate insulating film and a silicon nitride film (SiN$_y$ (y>0)) with a thickness of greater than or equal to 50 nm and less than or equal to 200 nm is stacked over the first gate insulating film as a second gate insulating film by sputtering. In this embodiment, a 100-nm-thick silicon oxide film is formed by RF sputtering under a condition that the pressure is 0.4 Pa, the high-frequency power is 1.5 kW, and an atmosphere containing oxygen and argon (an oxygen flow rate of 25 sccm:an argon flow rate of 25 sccm=1:1) is used.

Next, second heat treatment (preferably at higher than or equal to 200° C. and lower than or equal to 400° C., for example, higher than or equal to 250° C. and lower than or equal to 350° C.) is performed in an inert gas atmosphere or an oxygen gas atmosphere. By the heat treatment, oxygen is supplied to an oxygen deficiency generated by the first heat treatment, so that it is possible to reduce the oxygen deficiency which serves as a donor, to satisfy the stoichiometric proportion, and to make the oxide semiconductor film 107 to be an i-type semiconductor or a substantially i-type semiconductor. Note that the second heat treatment may be performed after formation of any of the following: the third electrode 113, an insulating film 117, and wirings 125 and 129. By the heat treatment, it is possible to diffuse hydrogen or water contained in the oxide semiconductor film into the gate insulating film.

The third electrode 113 can be formed in such a manner that a conductive film to serve as the third electrode 113 is formed over the gate insulating film 111 by a sputtering method, a CVD method, or a vacuum evaporation method, a resist mask is formed in a photolithography step over the conductive film, and the conductive film is etched using the resist mask.

In this embodiment, after a titanium film having a thickness of 150 nm is formed by a sputtering method, etching is performed using a resist mask formed in a photolithography step, so that the third electrode 113 is formed.

Through the above-described steps, the transistor 145 including the oxide semiconductor film 107 that is highly-purified and whose hydrogen concentration is reduced can be manufactured.

Figure 12B:
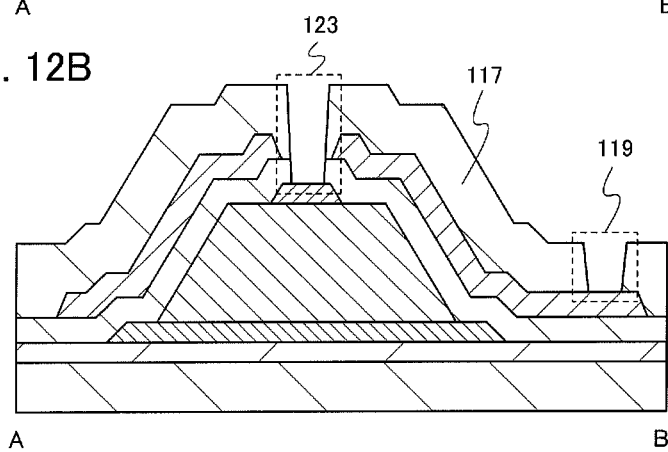

Next, as illustrated in FIG. 12B, after the insulating film 117 is formed over the gate insulating film 111 and the third electrode 113, contact holes 119 and 123 are formed.

The insulating film 117 is formed using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked.

The insulating film 117 is formed by a sputtering method, a CVD method, or the like. Note that when the insulating film 117 is formed by a sputtering method, an insulating film may be formed in such a manner that the substrate 101 is heated to a temperature of 100° C. to 400° C., a sputtering gas in which hydrogen, water, hydroxy group, hydride, or the like is removed and which contains high-purity nitrogen is introduced, and a silicon target is used. Also in this case, an insulating film is preferably formed in the state where hydrogen, water, hydroxy group, hydride, or the like remaining in the treatment chamber is removed.

After the formation of the insulating film 117, heat treatment may be further performed at higher than or equal to 100° C. and lower than or equal to 200° C. in the air for longer than or equal to 1 hour and shorter than or equal to 30 hours. With this heat treatment, a normally-off transistor can be obtained. Thus, the reliability of a display device or a semiconductor device can be increased.

A resist mask is formed in a photolithography step, and parts of the gate insulating film 111 and the insulating film 117 are removed by selective etching, whereby the contact holes 119 and 123 which reach the first electrode 105, the second electrode 109, and the third electrode 113 are formed.

Figure 12C:
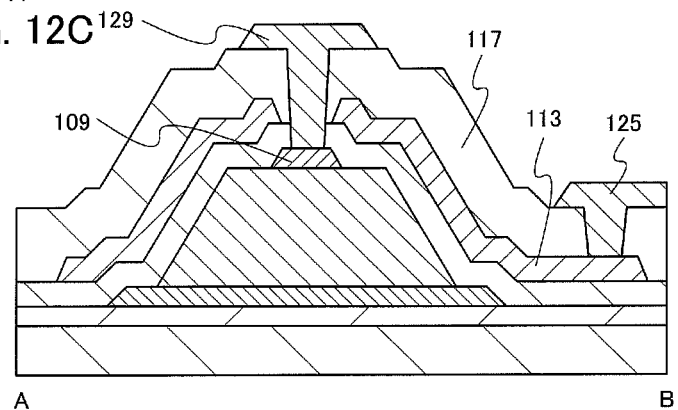

Next, after a conductive film is formed over the gate insulating film 111 and in the contact holes 119 and 123, etching is performed using a resist mask formed in a photolithography step, whereby the wirings 125 and 129 are formed (see FIG. 12C). Note that a resist mask may be formed by an ink-jet method. No photomask is used when a resist mask is formed by an ink-jet method; therefore, production cost can be reduced.

The wirings 125 and 129 can be formed in a manner similar to that of the first electrode 105.

Note that a planarization insulating film for planarization may be provided between the third electrode 113 and the wirings 125 and 129. An organic material having heat resistance, such as polyimide, acrylic, benzocyclobutene, polyamide, or epoxy can be given as typical examples of the planarization insulating film. Other than such organic materials, it is also possible to use a low-dielectric constant material (a low-k material), a siloxane-based resin, phosphosilicate glass (PSG), borophosphosilicate glass (BPSG), or the like. Note that the planarization insulating film may be formed by stacking a plurality of insulating films formed using these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating film. The planarization insulating film can be formed, depending on the material, by a method such as sputtering, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

Through the above-described steps, the concentration of hydrogen in the oxide semiconductor film can be reduced and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which hydrogen concentration is reduced and which is highly purified, it is possible to manufacture a transistor with a high withstand voltage, a high resistance to a short-channel effect, and a high on/off ratio.

This embodiment can be implemented in combination with any of the structures described in the other embodiments as appropriate.

Embodiment 7

In this embodiment, a manufacturing method of the transistor in Embodiment 2 will be described with reference to FIGS. 11A to 11C and FIG. 13.

In a manner similar to that in Embodiment 6, as illustrated in FIG. 11A, an insulating film 103 and a first electrode 105 are formed over a substrate 101. Next, as illustrated in FIG. 11C through a step illustrated in FIG. 11B, an oxide semiconductor film 107 and a second electrode 109 are formed over the first electrode 105.

Figure 13:
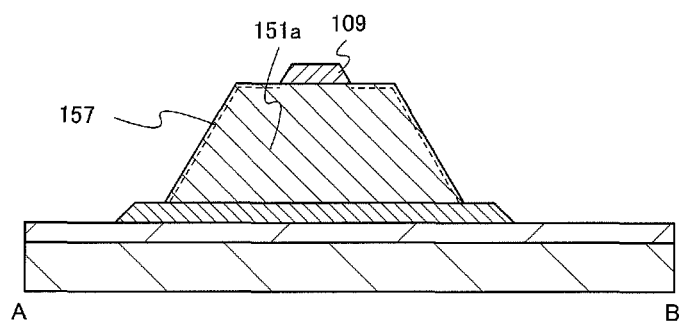
FIG. 13 illustrates a cross-sectional view for describing a method for manufacturing a transistor.

Next, first heat treatment is performed. The first heat treatment in this embodiment is different from the first heat treatment in the above embodiment. The heat treatment makes it possible to form an oxide semiconductor film 151$a$ in which a crystal region 157 is formed in a superficial portion as illustrated in FIG. 13.

In this embodiment, the first heat treatment is performed with an apparatus for heating an object to be processed by at least one of thermal conduction and thermal radiation from a heater such as a resistance heater. Here, it is preferable that the heat treatment be performed at higher than or equal to 500° C. and lower than or equal to 750° C., more preferably, higher than or equal to 550° C. and lower than a strain point of the substrate. Note that, although there is no requirement for the upper limit of the heat treatment temperature from the essential part of the invention, the upper limit of the heat treatment temperature needs to be within the allowable temperature limit of the substrate 101. The time for the heat treatment is preferably longer than or equal to 1 minute and shorter than or equal to 10 minutes. With the RTA treatment, heat treatment can be performed in a short time; thus, the adverse effect of heat on the substrate 101 can be reduced. In other words, it is possible to raise the upper limit of the heat treatment temperature as compared with the case where heat treatment is performed for a long time. Further, the crystal region of a predetermined structure can be selectively formed in the vicinity of the surface of the oxide semiconductor film.

As a heating apparatus that can be used in this embodiment, an RTA (rapid thermal anneal) apparatus such as a GRTA (gas rapid thermal anneal) apparatus or an LRTA (lamp rapid thermal anneal) apparatus, or the like can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

For example, the first heat treatment can employ GRTA, in which the substrate is moved into an inert gas atmosphere such as nitrogen or a rare gas heated to a high temperature of 650° C. to 700° C., and heated for several minutes there, and then the substrate is moved out of the inert gas heated to a high temperature. With GRTA, high-temperature heat treatment for a short period of time can be achieved.

Note that in the first heat treatment, it is preferable that hydrogen, water, hydroxy group, hydride, or the like be not contained in nitrogen or a rare gas such as helium, neon, or argon. Alternatively, the purity of nitrogen or a rare gas such as helium, neon, or argon introduced in a heat treatment apparatus is preferably 6 N (99.9999%) or higher, more preferably 7 N (99.99999%) or higher (that is, the concentration of the impurities is 1 ppm or lower, preferably 0.1 ppm or lower).

Note that the above heat treatment may be performed at any timing as long as it is performed after the oxide semiconductor film is formed; however, in order to promote dehydration or dehydrogenation, the heat treatment is preferably performed before other components are formed on a surface of the oxide semiconductor film 107. In addition, the heat treatment may be performed plural times instead of once.

After that, a gate insulating film and a third electrode that functions as a gate electrode are formed in a manner similar to that in Embodiment 6 to complete the transistor.

Because the oxide semiconductor film 151$a$ includes the crystal region 157 on a surface, resistance between the source and the drain is reduced, and the carrier mobility at the surface of the oxide semiconductor film 151$a$ is increased. Thus, the transistor including the oxide semiconductor film 151$a$ can have high field-effect mobility and favorable electric characteristics.

Further, the crystal region 157 is more stable than the amorphous region 155; therefore, when the crystal region 157 is included in the vicinity of the surface of an oxide semiconductor film 151, the entry of impurities (e.g., hydrogen, water, hydroxy group, hydride, or the like) into the amorphous region 155 can be reduced. Thus, the reliability of the oxide semiconductor film 151$a$ can be increased.

Through the above-described steps, the concentration of hydrogen in the oxide semiconductor film can be reduced and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which hydrogen concentration is reduced and which is highly purified, it is possible to manufacture a transistor with a high withstand voltage, a high resistance to a short-channel effect, and a high on/off ratio.

This embodiment can be implemented in combination with any of the structures described in the other embodiments as appropriate.

Embodiment 8

In this embodiment, a manufacturing method of a transistor illustrated in FIGS. 4A to 4C will be described with reference to FIGS. 4A to 4C and FIGS. 14A to 14C.

Figure 14A:
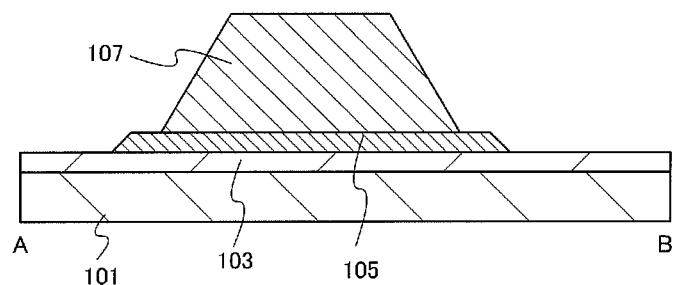
FIGS. 14A to 14C illustrate cross-sectional views for describing a method for manufacturing a transistor.
Figure 14B:
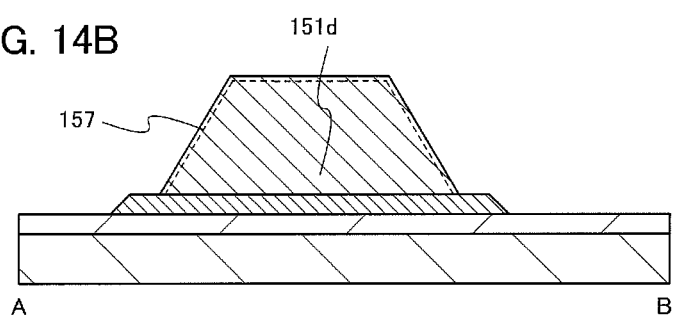

In a manner similar to that in Embodiment 6, as illustrated in FIG. 14A, an insulating film 103 is formed over a substrate 101, an island-shaped first electrode 105 is formed, and an island-shaped oxide semiconductor film 107 is formed over the island-shaped first electrode 105.

Next, first heat treatment is performed, so that an oxide semiconductor film 151d including a crystal region 157 in a superficial portion is formed.

The first heat treatment here may be performed under the conditions for forming the crystal region in the superficial portion of the oxide semiconductor film in the first heat treatment described in Embodiment 6, or may be performed in a manner similar to the first heat treatment described in Embodiment 7.

Figure 14C:
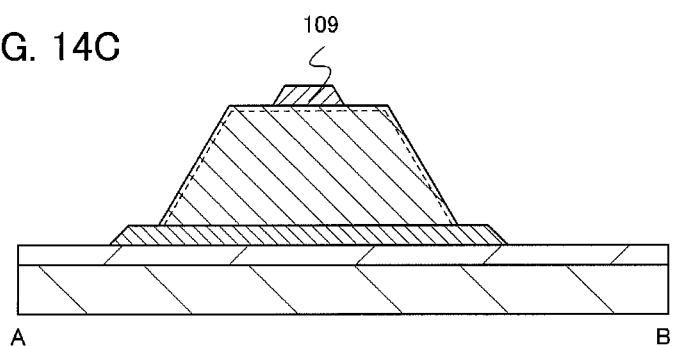

Next, after a conductive film is formed over the insulating film 103, the first electrode 105, and the oxide semiconductor film 151d, etching is performed on the conductive film using a resist mask formed in a photolithography step, whereby a second electrode 109 is formed as illustrated in FIG. 14C.

After that, a gate insulating film and a third electrode that functions as a gate electrode are formed in a manner similar to that in Embodiment 6. Note that in the second heat treatment described in Embodiment 6, when the second electrode 109 and oxygen in the oxide semiconductor film 151d are not reacted with each other, the oxide semiconductor film 151b including the crystal region 157 in the superficial portion that is in contact with the gate insulating film 111 and the second electrode 109 is formed as illustrated in FIG. 4B.

On the other hand, in the second heat treatment described in Embodiment 6, when the second electrode 109 and oxygen in the oxide semiconductor film 151d are reacted with each other, oxygen is eliminated from the crystal region in the superficial portion of the oxide semiconductor film, so that the region has an amorphous structure. As a result, as illustrated in FIG. 4C, an oxide semiconductor film 151c including the superficial portion that is in contact with the gate insulating film 111, the crystal region 157 in a region apart from the second electrode 109 at a certain distance, and an amorphous region 159 in the superficial portion that is in contact with the second electrode 109 is formed.

Through the above-described steps, a transistor with high field-effect mobility and favorable electric characteristics can be manufactured.

This embodiment can be implemented in combination with any of the structures described in the other embodiments as appropriate.

Embodiment 9

In this embodiment, manufacturing processes of the transistor illustrated in FIGS. 1A and 1B will be described with reference to FIGS. 11A to 11C.

In a manner similar to that in Embodiment 6, as illustrated in FIG. 11A, an insulating film 103 is formed over a substrate 101 and a first electrode 105 is formed over the insulating film 103.

Figure 11C:
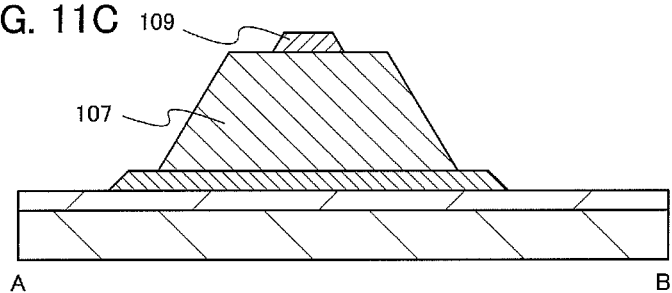

Next, as illustrated in FIG. 11C through a step illustrated in FIG. 11B, an oxide semiconductor film 107 and a second electrode 109 are formed over the first electrode 105.

Note that before the oxide semiconductor film is formed by a sputtering method, reverse sputtering in which plasma is generated by introduction of an argon gas is preferably performed and particles attached to the surface of the first electrode 105 are removed, so that resistance at the interface between the first electrode 105 and the oxide semiconductor film can be reduced. Note that instead of an argon atmosphere, a nitrogen atmosphere, a helium atmosphere, or the like may be used.

An oxide semiconductor film is formed by a sputtering method over the substrate 101 and the first electrode 105. Next, a conductive film is formed over the oxide semiconductor film.

In this embodiment, the oxide semiconductor film is formed by a sputtering method with the use of an In—Ga—Zn—O-based metal oxide target. In this embodiment, the substrate is held inside a treatment chamber which is kept in a reduced pressure state, and the substrate is heated to a temperature of higher than or equal to room temperature and lower than 400° C. The oxide semiconductor film is formed over the substrate 101 and the first electrode 105 in such a manner that a sputtering gas from which hydrogen, water, hydroxy group, hydride, or the like is removed is introduced and a metal oxide is used as a target in the state where hydrogen, water, hydroxy group, hydride, or the like remaining in the treatment chamber is removed. An entrapment vacuum pump is preferably used for removing hydrogen, water, hydroxy group, hydride, or the like remaining in the treatment chamber. For example, a cryopump, an ion pump, or a titanium sublimation pump is preferably used. The evacuation unit can be a turbo pump provided with a cold trap. In the treatment chamber which is evacuated with the cryopump, hydrogen, water, hydroxy group, hydride (more preferably, including a compound containing a carbon atom), or the like is removed, whereby the concentration of impurities in the oxide semiconductor film formed in the treatment chamber can be reduced. In addition, by performing sputtering in the state where hydrogen, water, hydroxy group, hydride, or the like remaining in the treatment chamber is removed with a cryopump, even at a substrate temperature of room temperature to lower than 400° C., impurities such as a hydrogen atom or water that can serve as donors can be reduced, and an i-type oxide semiconductor film or a substantially i-type oxide semiconductor film in which the stoichiometric proportion is satisfied can be formed.

In this embodiment, a deposition condition is employed such that the distance between the substrate and the target is 100 mm, the pressure is 0.6 Pa, the direct current (DC) power supply is 0.5 kW, and the atmosphere is an oxygen (the proportion of oxygen flow is 100%) atmosphere. Note that a pulsed direct-current (DC) power source is preferably used, in which case powder substances (also referred to as particles or dust) that are generated in film formation can be reduced and the film thickness can be uniform. The thickness of the oxide semiconductor film is preferably greater than or equal to 30 nm and less than or equal to 3000 nm. Note that the preferable thickness varies depending on an oxide semiconductor film material used; thus, the appropriate thickness may be determined depending on a material.

Next, as illustrated in FIG. 12A, in a manner similar to that in Embodiment 6, the gate insulating film 111 is formed over the first electrode 105, the oxide semiconductor film 107, and the second electrode 109. Note that since the concentration of hydrogen contained in the oxide semiconductor film is reduced in this embodiment, the first heat treatment described in Embodiment 6 before formation of the gate insulating film 111 is not necessarily performed. As the gate insulating film 111, a gate insulating film that has a favorable characteristic of an interface between the gate insulating film 111 and the oxide semiconductor film 107 is preferable. The gate insulating film 111 is preferably formed by high-density plasma CVD method using a microwave (2.45 GHz), in which case the gate insulating film 111 can be dense and can have high withstand voltage and high quality. In addition, another film formation method such as a sputtering method or a plasma CVD method can be employed as long as the method enables formation of a good-quality insulating film as a gate insulating film. Further, a surface of the insulating film formed by a sputtering method or a plasma CVD method is preferably irradiated with high-density plasma generated using a microwave (2.45 GHz), in which case the gate insulating film 111 can be more dense and can have higher withstand voltage and higher quality.

Note that before the gate insulating film 111 is formed, reverse sputtering is preferably performed so that resist residues and the like attached to at least a surface of the oxide semiconductor film 107 are removed.

Further, before the gate insulating film 111 is formed, hydrogen, water, hydroxy group, hydride, or the like attached to an exposed surface of the oxide semiconductor film may be removed by plasma treatment using a gas such as $N_2O$, $N_2$, or Ar. Plasma treatment may be performed using a mixture gas of oxygen and argon as well. In the case where plasma treatment is performed, the gate insulating film 111 which is to be in contact with part of the oxide semiconductor film is preferably formed without being exposed to the air.

Further, it is preferable that the substrate 101 over which components up to and including the first electrode 105 to the second electrode 109 are formed be preheated in a preheating chamber in a sputtering apparatus as pretreatment to eliminate and evacuate hydrogen, water, hydroxy group, hydride, or the like adsorbed on the substrate 101 so that hydrogen, water, hydroxy group, hydride, or the like is contained as little as possible in the gate insulating film 111. Alternatively, it is preferable that the substrate 101 be preheated in a preheating chamber in a sputtering apparatus to eliminate and evacuate impurities such as hydrogen, water, hydroxy group, hydride, or the like adsorbed on the substrate 101 after the gate insulating film 111 is formed. The preheat temperature is higher than or equal to 100° C. and lower than or equal to 400° C., preferably higher than or equal to 150° C. and lower than or equal to 300° C. Note that a cryopump is preferable as an evacuation means provided for the preheating chamber. Note that this preheating treatment can be omitted.

The gate insulating film 111 can have a structure in which a silicon oxide film and a silicon nitride film are stacked in that order over the first electrode 105, the oxide semiconductor film 107, and the second electrode 109. For example, a gate insulating film can be formed in such a manner that a silicon oxide film ($SiO_x$ ($x>0$)) with a thickness of greater than or equal to 5 nm and less than or equal to 300 nm is formed as a first gate insulating film by sputtering and a silicon nitride film ($SiN_y$ ($y>0$)) with a thickness of greater than or equal to 50 nm and less than or equal to 200 nm is stacked as a second gate insulating film over the first gate insulating film.

Next, as illustrated in FIG. 12A, in a manner similar to that in Embodiment 6, the third electrode 113 that functions as a gate electrode is formed over the gate insulating film 111.

Through the above-described steps, the transistor 145 including the oxide semiconductor film 107 in which the hydrogen concentration is reduced can be manufactured.

Hydrogen, water, hydroxy group, hydride, or the like is removed as described above in forming the oxide semiconductor film, whereby the concentration of hydrogen in the oxide semiconductor film can be reduced. Thus, the oxide semiconductor film can be stabilized.

Next, as illustrated in FIG. 12B, in a manner similar to that in Embodiment 6, the contact holes 119 and 123 are formed after the insulating film 117 is formed over the gate insulating film 111 and the third electrode 113. Note that after the formation of the insulating film 117, as in Embodiment 6, heat treatment may further be performed at higher than or equal to 100° C. and less than or equal to 200° C. for longer than or equal to 1 hour and shorter than or equal to 30 hours in the air. With this heat treatment, a normally-off transistor can be obtained. Thus, the reliability of a display device or a semiconductor device can be increased.

Next, as illustrated in FIG. 12C, in a manner similar to that in Embodiment 6, the wirings 125 and 129 are formed.

Note that a planarization insulating film for planarization may be provided between the third electrode 113 and the wirings 125 and 129.

When hydrogen, water, hydroxy group, hydride, or the like remaining in the reaction atmosphere is removed at the time of the formation of the oxide semiconductor film, the concentration of hydrogen in the oxide semiconductor film can be lowered and the oxide semiconductor film can be highly purified. Thus, the oxide semiconductor film can be stabilized. In addition, heat treatment at a temperature of lower than or equal to the glass transition temperature makes it possible to form an oxide semiconductor film with a wide band gap in which carrier density is extremely low. Therefore, a transistor can be manufactured using a large-sized substrate, so that productivity can be increased. In addition, by using the oxide semiconductor film in which hydrogen concentration is reduced and which is highly purified, it is possible to manufacture a transistor with a high withstand voltage, a high resistance to a short-channel effect, and a high on/off ratio.

This embodiment can be implemented in combination with any of the structures described in the other embodiments as appropriate.

Embodiment 10

A mode which uses a circuit including the transistor described in any of Embodiments 1 to 9 will be described.

The transistor described in any of Embodiments 1 to 9 has a high on-off ratio and high withstand voltage and is scarcely degraded. Thus, the transistor can be used in the following examples: a home electrical appliance in which an inverter technique is applied such as an air conditioner, a refrigerator, a rice cooker, or a solar power generation system; a battery-driven portable information terminal device such as a laptop computer; a power amplifier device such as a stroboscope, an electric vehicle; a DC-DC converter circuit; a motor control circuit; an audio amplifier; a logic circuit; a switch circuit; and a high-frequency linear amplifier.

Here, an example of a solar power generation system including an inverter formed using the transistor described in any of Embodiments 1 to 9 will be described with reference to FIG. 18. Note that an example of a structure of a solar power generation system installed on a house and the like is shown here.

A residential solar power generation system illustrated in FIG. 18 is a system in which a method for supplying electric power is changed in accordance with a state of solar power generation. When solar power generation is performed, for example, when the sun shines, electric power generated by solar power generation is consumed inside the house, and surplus electric power is supplied to an electric grid 414 that is led from an electric power company. On the other hand, at night time or at the time of rain when electric power is insufficient, electric power is supplied from the electric grid 414 and is consumed inside the house.

The residential solar power generation system illustrated in FIG. 18 includes a solar cell panel 400 which converts sunlight into electric power (direct current power), an inverter 404 which converts the electric power from direct current into alternating current, and the like. Alternating current power output from the inverter 404 is used as electric power for operating various types of electric devices 410.

Surplus electric power is supplied to outside the house through the electric grid 414. That is, electric power can be sold using this system. A direct current switch 402 is provided to select connection or disconnection between the solar cell panel 400 and the inverter 404. An alternating current switch 408 is provided to select connection or disconnection between a distribution board 406 and a transformer 412 connected to the electric grid 414.

When the semiconductor device of the disclosed invention is applied to the above inverter, a highly reliable and inexpensive solar power generation system can be realized.

The structures, methods, and the like described in this embodiment can be combined with any of the other embodiments as appropriate.

Example 1

In Example 1, calculation results of the thickness of an oxide semiconductor film of a transistor having a high on/off ratio and the channel width thereof with the use of a two dimensional device simulator will be described with reference to FIGS. 1A and 1B, FIG. 15, FIGS. 16A and 16B, and FIGS. 17A and 17B. Note that ATLAS developed by Silvaco, Inc. was used as the device simulator here.

First, the structure of the transistor on which the calculation was performed will be described with reference to FIG. 1A. The first electrode 105 and the second electrode 109 were assumed to be formed using a material (typically, titanium) that is capable of ohmic contact with the oxide semiconductor film 107, and the work function was 4.3 eV. The oxide semiconductor film 107 was assumed to be formed using an In—Ga—Zn—O film, and the electron affinity was 4.3 eV. The gate insulating film 111 was assumed to be formed using a 100-nm-thick $SiO_2$ film. The thickness of the oxide semiconductor film 107 was $L_1$. The calculation was performed with $W_2$ in FIG. 1A fixed to 1 μm and $W_1$ and $L_1$ varied.

The on/off ratio was calculated by the device simulator. The relation between $L_1$ and $W_1$ that enables operation with the on/off ratio of $1\times10^7$ is expressed by a straight line 201. The region of the relation between $L_1$ and $W_1$ that enables operation with the on/off ratio of $1\times10^7$ or higher is expressed by a hatching 203 (see FIG. 15).

Figure 15:
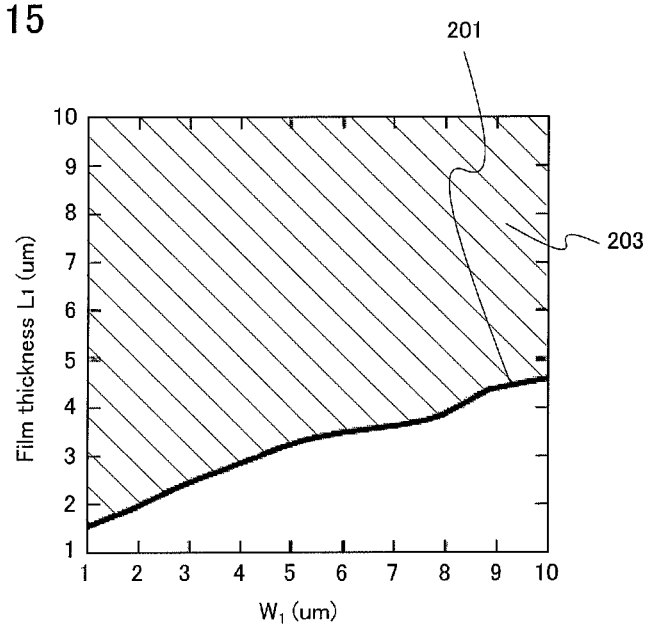
FIG. 15 shows results of calculation by a device simulator.

When the relation between $L_1$ and $W_1$ is located in the region expressed by the hatching 203 in FIG. 15, the on/off ratio of the transistor can be increased.

Figure 16A:
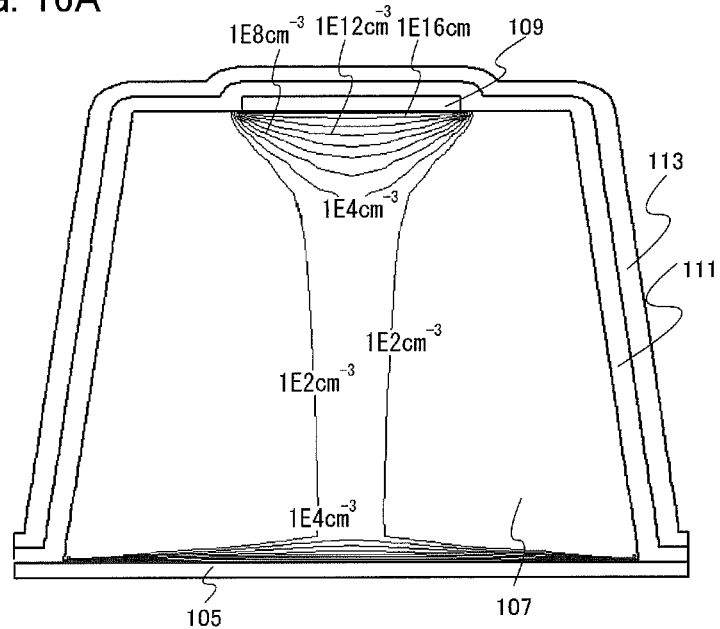
FIGS. 16A and 16B show results of calculation by a device simulator.
Figure 16B:
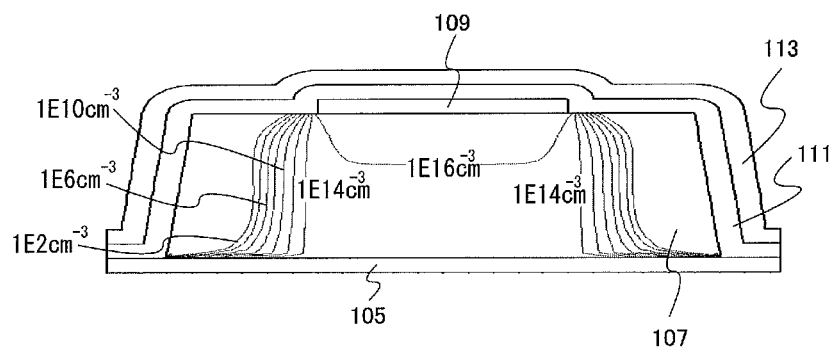
Figure 17A:
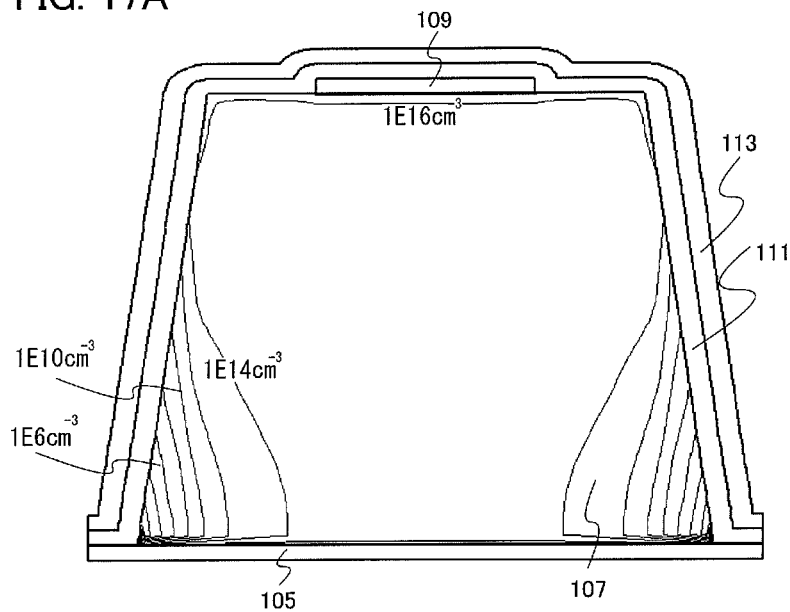
FIGS. 17A and 17B show results of calculation by a device simulator.
Figure 17B:
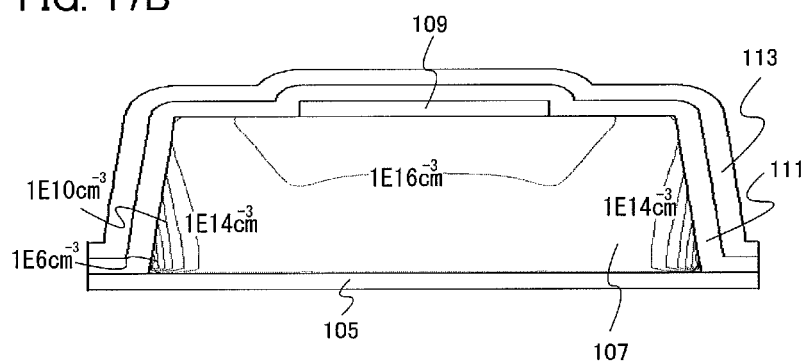

Next, FIG. 16A and FIG. 17A each show carrier density distribution in an oxide semiconductor film when $L_1$ was 3 μm, $W_1$ was 2 μm, and the width of the second electrode 109 was 1 μm. FIG. 16B and FIG. 17B each show carrier density distribution in an oxide semiconductor film when $L_1$ was 1 μm, $W_1$ was 2 μm, and the width of the second electrode 109 was 1 μm. Note that FIGS. 16A and 16B each show carrier density distribution in an off-state when $V_{GS}$ (a gate-source voltage) was −2 V, and FIGS. 17A and 17B each show carrier density distribution in an on-state when $V_{GS}$ (a gate-source voltage) was +2 V. Note also that although the third electrode 113 covers the second electrode 109 with the gate insulating film 111 interposed therebetween, this was for simplification of the figure of the simulation, and did not have an influence on the simulation results.

In the transistor illustrated in FIG. 16A, a region with a low carrier density (a carrier density of $1\times10^2$ $cm^{-3}$ to $1\times10^4$ $cm^{-3}$) spreads to the center of the oxide semiconductor film 107, and regions with a high carrier density are located separately on the first electrode 105 side and the second electrode 109 side; therefore, the off-state current in an off-state can be reduced as compared with the transistor illustrated in FIG. 16B. In each of FIGS. 17A and 17B, the electron density is high not only at the surface of the oxide semiconductor film 107 but also in the center thereof; therefore, it is found that a channel formation region is formed not only at the surface of the oxide semiconductor film that is in contact with the gate insulating film but also inside the oxide semiconductor film. In addition, the region with high carrier density spreads more in the second electrode 109 side than in the first electrode 105 side. From the above, it is found that the transistor described in Example 1 can have a high on-state current.

Example 2

Figure 19:
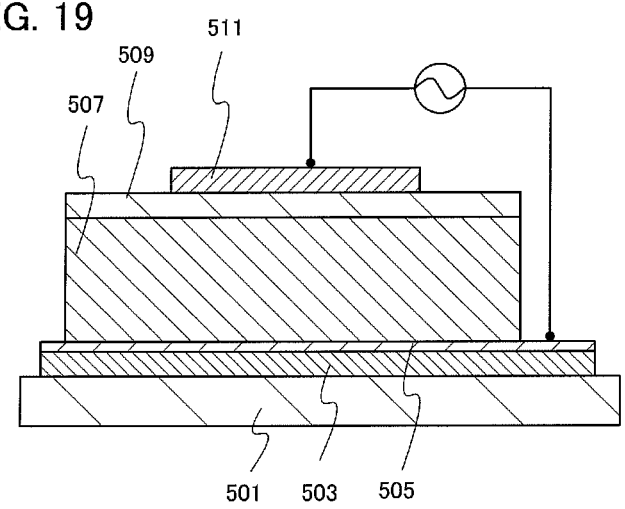
FIG. 19 illustrates a view for explaining a CV measurement.

In Example 2, the carrier density of an oxide semiconductor film will be described with reference to FIG. 19 and FIGS. 20A and 20B.

First, the structure of a sample used for capacitor voltage (CV) measurement will be described with reference to FIG. 19.

A 300-nm-thick titanium film 503 was formed by a sputtering method over a glass substrate 501, and a 100-nm-thick titanium nitride film 505 was formed by a sputtering method thereover.

As an oxide semiconductor film 507 over the titanium nitride film 505, a 2000-nm-thick In—Ga—Zn—O film was formed by a sputtering method. The deposition conditions at this time were as follows: the sputtering gases were Ar with a flow rate of 30 sccm and oxygen with a flow rate of 15 sccm; the distance between a target and the substrate was 60 mm, a direct current (DC) power source was 0.5 kW; and the deposition temperature was room temperature.

Next, a 300-nm-thick silicon oxynitride film 509 was formed by a CVD method, and a 300-nm-thick silver film 511 was formed thereover.

Figure 20A:
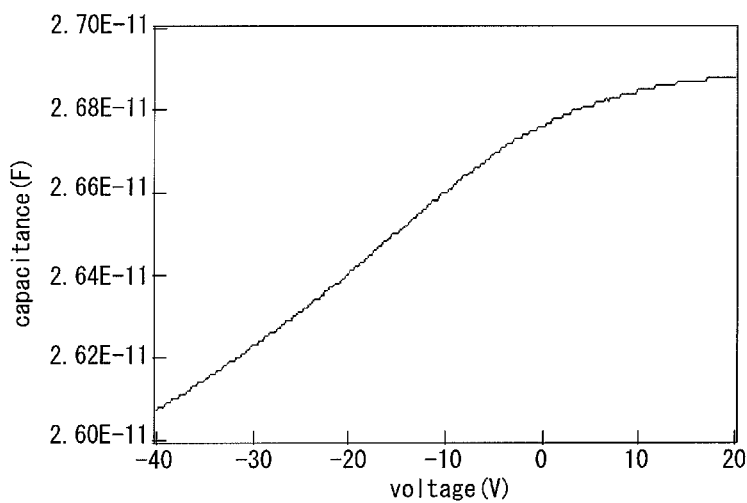
FIGS. 20A and 20B show results of the CV measurement.
Figure 20B:
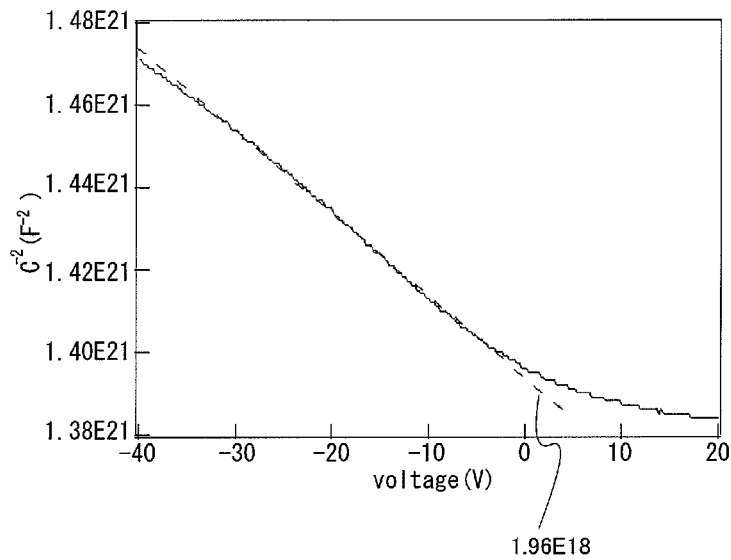

Next, results of the CV measurement on the sample are shown in FIG. 20A, and a curve of $C^{-2}$ with respect to voltage according to the measurement results shown in FIG. 20A is shown in FIG. 20B. Note that the slope of the curve of $C^{-2}$ of the sample in a weak inversion state is substituted into Formula 7, whereby the carrier density can be obtained. Note that the curve of $C^{-2}$ is illustrated as a solid line in FIG. 20B, and the slope of the curve of $C^{-2}$ in a weak inversion state is illustrated as a dashed line. The slope was $1.96 \times 10^{18}\, C^{-2}V^{-1}$.

$$n = -\left(\frac{2}{e\varepsilon_0\varepsilon_s}\right) \bigg/ \frac{d(1/C)^2}{dV} \quad \text{[Formula 7]}$$

Note that e represents elementary electric charge, $\varepsilon_s$ represents dielectric constant of an oxide semiconductor, $\varepsilon_0$ represents permittivity of a vacuum, and n represents carrier density.

From Formula 7, it is found that the carrier density of the oxide semiconductor film in Example 2 is $6 \times 10^{10}\, cm^{-3}$. From the above, it is found that the carrier density of the oxide semiconductor film described in Example 2 is extremely low.

Example 3

In Example 3, analysis results of an oxide semiconductor film which was subjected to dehydration or dehydrogenation by heat treatment with use of a TEM analysis will be described with reference to FIGS. 21A and 21B, FIGS. 22A and 22B, and FIGS. 23A to 23F.

First, methods for manufacturing samples will be described.

Oxide semiconductor films were formed by a sputtering method over substrates 601.

In Example 3, as each of the substrates 601, an Eagle XG substrate (manufactured by Corning Incorporated) was used. As each of the oxide semiconductor films, an In—Ga—Zn—O film 603 was deposited with use of the metal oxide target of $In_2O_3:Ga_2O_3:ZnO=1:1:1$. One of the samples here is referred to as Sample B, which is a comparative example.

Next, heat treatment was performed on the other sample at 650° C. for 60 minutes in a nitrogen atmosphere with use of an electric furnace apparatus. The oxide semiconductor film after the heat treatment is an oxide semiconductor film 605. This sample is referred to as Sample A.

Figure 21A:
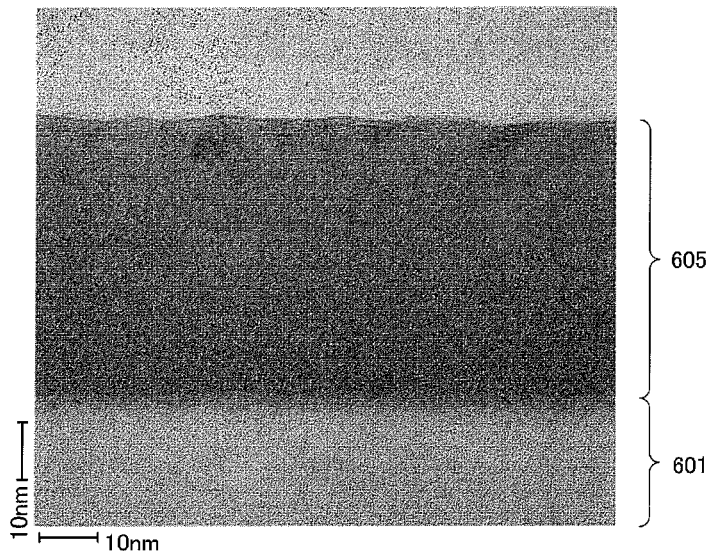
FIGS. 21A and 21B are TEM photographs of a cross section of an oxide semiconductor film.
Figure 21B:
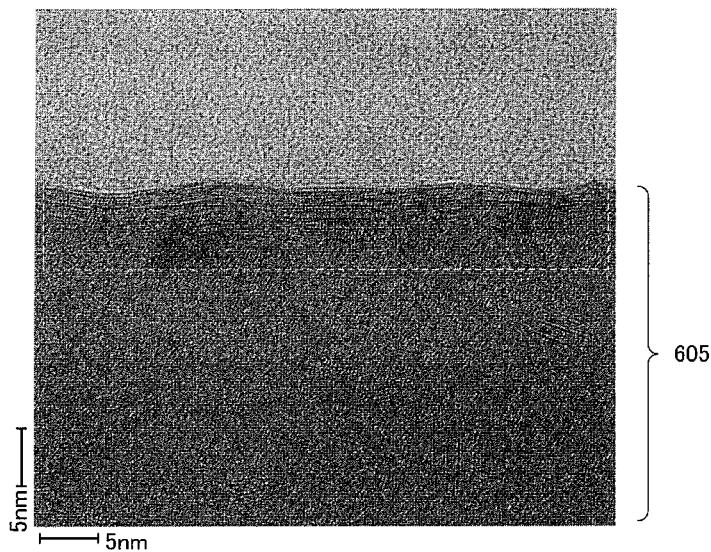
Figure 22A:
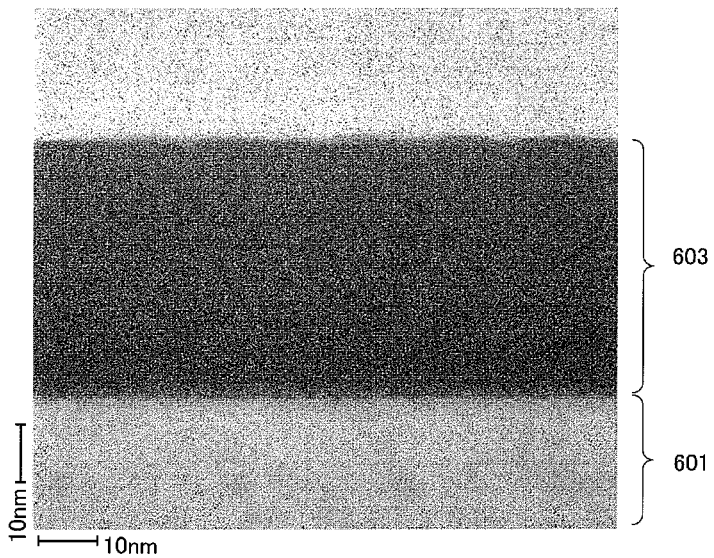
FIGS. 22A and 22B are TEM photographs of a cross section of an oxide semiconductor film.
Figure 22B:
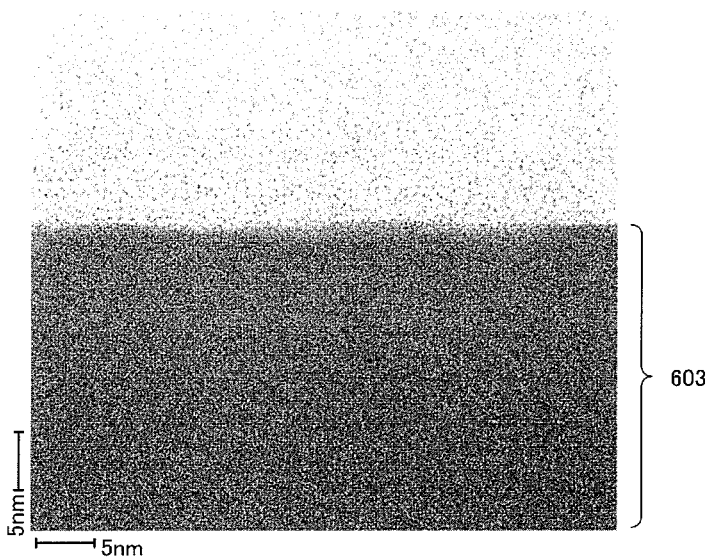

A cross section of a crystalline state of each sample was observed at an acceleration voltage of 300 kV using a high resolution transmission electron microscope ("H9000-NAR": TEM manufactured by Hitachi, Ltd.) to examine the crystalline state of each sample. FIGS. 21A and 21B show cross-sectional photographs of Sample A, and FIGS. 22A and 22B show cross-sectional photographs of Sample B. Note that FIGS. 21A and 22A are low magnification photographs (two million-fold magnification), and FIGS. 21B and 22B are high magnification photographs (four million-fold magnification).

A continuous lattice image is observed in a superficial portion of a cross section of Sample A which was subjected to the heat treatment at 650° C. for 60 minutes in the electric furnace and is shown in FIGS. 21A and 21B. In particular, in the high magnification photograph of FIG. 21B, a clear lattice image is observed in a region surrounded by a white frame, which indicates the existence of crystals whose crystal axes are uniformly oriented. From the above, it is found that the superficial portion of the In—Ga—Zn—O film was crystallized through the heat treatment at 650° C. for 60 minutes in the electric furnace and included a crystal region. Note that in a region except for the superficial portion, a clear continuous lattice image is not observed and a state where microcrystalline particles exist here and there in an amorphous region is found. The microcrystals are so-called nanocrystals each with a grain size of greater than or equal to 2 nm and less than or equal to 4 nm.

On the other hand, a clear lattice image is not observed in any region in a thickness direction from the cross-sectional photographs of FIGS. 22A and 22B (Sample B), so that it is found that Sample B has an amorphous oxide semiconductor film.

Figure 23A:
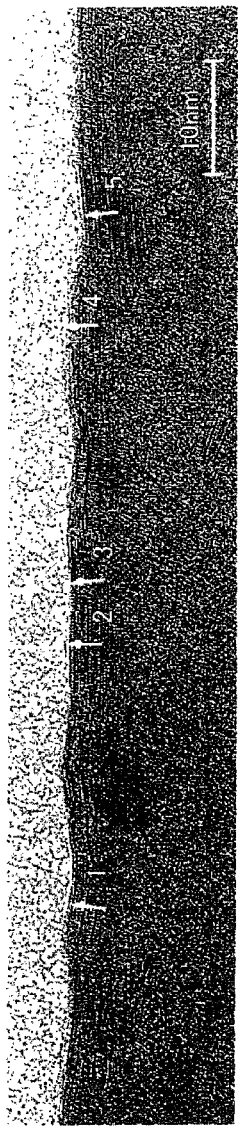
FIGS. 23A to 23F are a TEM photograph of a cross section of an oxide semiconductor film and electron diffraction patterns thereof.
Figures 23B, 23C, 23D, 23E, 23F:
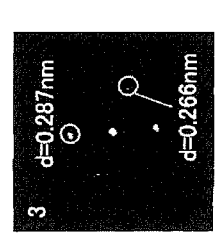

Next, FIG. 23A shows an macrophotography of the superficial portion of the oxide semiconductor film of Sample A which was subjected to the heat treatment at 650° C. for 60 minutes in the electric furnace, and FIGS. 23B to 23F show electron diffraction patterns of the crystal region. Directional arrows 1 to 5 indicating directions where lattice images are aligned are illustrated in the macrophotography of the superficial portion (FIG. 23A), and it is found that crystals are grown perpendicularly to a top surface of the film. The electron diffraction patterns shown in FIGS. 23B to 23F are observed at positions indicated by the arrows 1 to 5, respectively, and c-axis orientation can be seen. As a result of comparison between this electron diffraction pattern and a known lattice constant, it became clear that a crystal structure is $InGaZnO_4$.

From the above analysis results, it is found that the superficial portion of the oxide semiconductor film of the sample which was subjected to the heat treatment at 650° C. for 60 minutes in the electric furnace has a crystal region.

This application is based on Japanese Patent Application serial no. 2009-265028 filed with Japan Patent Office on Nov. 20, 2009, the entire contents of which are hereby incorporated by reference.

EXPLANATION OF REFERENCE

101: substrate, 103: insulating film, 105: electrode, 107: oxide semiconductor film, 108: conductive film, 109: electrode, 111: gate insulating film, 113: electrode, 117: insulating film, 119: contact hole, 123: contact hole, 125: wiring, 129: wiring, 131: wiring, 145: transistor, 151: oxide semiconductor film, 155: amorphous region, 157: crystal region, 159: amorphous region, 161: thick solid line, 163: thick dashed line, 165: thin solid line, 167: thin dashed line, 201: straight line, 203: hatching, 400: solar cell panel, 402: direct current switch, 404: inverter, 406: distribution board, 408: alternating current switch, 410: electric device, 412: transformer, 414: electric grid, 501: glass substrate, 503: titanium film, 505: titanium nitride film, 507: oxide semiconductor film, 509: silicon oxynitride film, 511: silver film, 601: substrate, 605: oxide semiconductor film, 110b: resist mask, 151a: oxide semiconductor film, 151b: oxide semiconductor film, 151c: oxide semiconductor film, 151d: oxide semiconductor film.

The invention claimed is:

1. A semiconductor device comprising:
a first electrode over a substrate;
an oxide semiconductor film over and in electrical contact with the first electrode, the oxide semiconductor film having a thickness of greater than 3 μm;
a second electrode over and in electrical contact with the oxide semiconductor film;
a gate insulating film over the second electrode, the gate insulating film being in contact with an end portion of a top surface and a side surface of the oxide semiconductor film; and
a third electrode over the gate insulating film, the third electrode having an opening overlapping the second electrode, wherein the third electrode faces a side surface of the oxide semiconductor film and the end portion of the top surface of the oxide semiconductor film with the gate insulating film provided between the third electrode and the oxide semiconductor film.

2. The semiconductor device according to claim 1, wherein the oxide semiconductor film comprises a crystal region, and
wherein the crystal region is in contact with the gate insulating film.

3. The semiconductor device according to claim 1, wherein the oxide semiconductor film comprises a crystal region, and
wherein the crystal region is in contact with the gate insulating film and the second electrode.

4. The semiconductor device according to claim 1, wherein the first electrode is one of a source electrode and a drain electrode,
wherein the second electrode is the other of the source electrode and the drain electrode, and
wherein the third electrode is a gate electrode.

5. The semiconductor device according to claim 1, wherein the oxide semiconductor film has a carrier density of lower than $1 \times 10^{14}$ cm$^{-3}$.

6. The semiconductor device according to claim 1, wherein the oxide semiconductor film has a carrier density of lower than $1 \times 10^{12}$ cm$^{-3}$.

7. The semiconductor device according to claim 1, wherein the oxide semiconductor film has a hydrogen concentration of lower than $1 \times 10^{16}$ cm$^{-3}$.

8. The semiconductor device according to claim 1, wherein a channel is formed in an entire region of the oxide semiconductor film.

9. The semiconductor device according to claim 1, wherein the third electrode has a ring shape.

10. A semiconductor device comprising:
a first electrode over a substrate;
an oxide semiconductor film over and in electrical contact with the first electrode, the oxide semiconductor film having a thickness of greater than 3 µm;
a second electrode over and in electrical contact with the oxide semiconductor film;
a gate insulating film over the second electrode, the gate insulating film being in contact with an end portion of a top surface and a side surface of the oxide semiconductor film; and
a third electrode over the gate insulating film, the third electrode having an opening overlapping the second electrode,
wherein a third electrode faces a side surface of the oxide semiconductor film and the end portion of the top surface of the oxide semiconductor film with the gate insulating film provided between the third electrode and the oxide semiconductor film,
wherein a length of a top surface of the first electrode is longer than a length of a bottom surface of the oxide semiconductor film, and
wherein a length of a top surface of the oxide semiconductor is longer than a length of a bottom surface of the second electrode.

11. The semiconductor device according to claim 10, wherein the oxide semiconductor film comprises a crystal region, and
wherein the crystal region is in contact with the gate insulating film.

12. The semiconductor device according to claim 10, wherein the oxide semiconductor film comprises a crystal region, and
wherein the crystal region is in contact with the gate insulating film and the second electrode.

13. The semiconductor device according to claim 10, wherein the first electrode is one of a source electrode and a drain electrode,
wherein the second electrode is the other of the source electrode and the drain electrode, and
wherein the third electrode is a gate electrode.

14. The semiconductor device according to claim 10, wherein the oxide semiconductor film has a carrier density of lower than $1 \times 10^{14}$ cm$^{-3}$.

15. The semiconductor device according to claim 10, wherein the oxide semiconductor film has a carrier density of lower than $1 \times 10^{12}$ cm$^{-3}$.

16. The semiconductor device according to claim 10, wherein the oxide semiconductor film has a hydrogen concentration of lower than $1 \times 10^{16}$ cm$^{-3}$.

17. The semiconductor device according to claim 10, wherein a channel is formed in an entire region of the oxide semiconductor film.

18. The semiconductor device according to claim 10, wherein the third electrode has a ring shape.

19. A semiconductor device comprising:
a first electrode over a substrate;
an oxide semiconductor film over and in electrical contact with the first electrode, the oxide semiconductor film having a thickness of greater than 3 µm;
a second electrode over and in electrical contact with the oxide semiconductor film;
a gate insulating film having a first opening over the second electrode, the gate insulating film being in contact with an end portion of a top surface and a side surface of the oxide semiconductor film;
a third electrode over the gate insulating film, the third electrode having a second opening overlapping the second electrode,
wherein the third electrode faces a side surface of the oxide semiconductor film and the end portion of the top surface of the oxide semiconductor film with the gate insulating film provided between the third electrode and the oxide semiconductor film;
an interlayer insulating film over the third electrode, the interlayer insulating film having a third opening; and
a wiring over the interlayer insulating film, the wiring being electrically connected to the second electrode through the first opening, the second opening and the third opening.

20. The semiconductor device according to claim 19, wherein the oxide semiconductor film comprises a crystal region, and
wherein the crystal region is in contact with the gate insulating film.

21. The semiconductor device according to claim 19, wherein the oxide semiconductor film comprises a crystal region, and
wherein the crystal region is in contact with the gate insulating film and the second electrode.

22. The semiconductor device according to claim 19, wherein the first electrode is one of a source electrode and a drain electrode,
wherein the second electrode is the other of the source electrode and the drain electrode, and
wherein the third electrode is a gate electrode.

23. The semiconductor device according to claim 19, wherein the oxide semiconductor film has a carrier density of lower than $1\times10^{14}$ cm$^{-3}$.

24. The semiconductor device according to claim 19, wherein the oxide semiconductor film has a carrier density of lower than $1\times10^{12}$ cm$^{-3}$.

25. The semiconductor device according to claim 19, wherein the oxide semiconductor film has a hydrogen concentration of lower than $1\times10^{16}$ cm$^{-3}$.

26. The semiconductor device according to claim 19, wherein a channel is formed in an entire region of the oxide semiconductor film.

27. The semiconductor device according to claim 19, wherein the third electrode has a ring shape.

28. The semiconductor device according to claim 1, wherein each of the first electrode and the second electrode comprises a metal element selected from aluminum, chromium, copper, tantalum, titanium, molybdenum, tungsten and yttrium, or an alloy comprising any of the metal element selected from aluminum, chromium, copper, tantalum, titanium, molybdenum, tungsten and yttrium, or one or more metal elements selected from manganese, magnesium, zirconium and beryllium.

* * * * *